(12) United States Patent
Guo

(10) Patent No.: US 11,300,628 B2
(45) Date of Patent: Apr. 12, 2022

(54) METHOD OF DETERMINING AN AGING DIFFERENCE OF A PLURALITY OF BATTERY CELLS CONNECTED IN PARALLEL OF A BATTERY PACK AND RELATED BATTERY DIAGNOSING SYSTEM

(71) Applicant: Simplo Technology Co., Ltd., Hsinchu County (TW)

(72) Inventor: Yi-Ren Guo, Kaohsiung (TW)

(73) Assignee: Simplo Technology Co., Ltd., Hsinchu County (TW)

( * ) Notice: Subject to any disclaimer, the term of this patent is extended or adjusted under 35 U.S.C. 154(b) by 0 days.

(21) Appl. No.: 17/142,262

(22) Filed: Jan. 6, 2021

(65) Prior Publication Data

US 2021/0208203 A1 Jul. 8, 2021

(30) Foreign Application Priority Data

Jan. 7, 2020 (TW) .................................. 109100457

(51) Int. Cl.
| | | |
|---|---|---|
| *G01R 31/392* | (2019.01) | |
| *H02J 1/14* | (2006.01) | |
| *H01M 10/48* | (2006.01) | |
| *G01R 31/382* | (2019.01) | |

(52) U.S. Cl.
CPC ......... *G01R 31/392* (2019.01); *G01R 31/382* (2019.01); *H01M 10/48* (2013.01); *H02J 1/14* (2013.01)

(58) Field of Classification Search
CPC ... G01R 31/392; G01R 31/382; H01M 10/48; H01M 10/0525; H02J 1/14; Y02E 60/10; B82Y 30/00
USPC ............... 324/200, 207.11–207.19, 219–241, 324/425–437, 443–447, 500, 515, 529, 324/530, 750.06
See application file for complete search history.

(56) References Cited

U.S. PATENT DOCUMENTS

| | | | | |
|---|---|---|---|---|
| 10,497,988 B2 * | 12/2019 | Oh | ........................ | H02J 7/0021 |
| 2003/0052689 A1 * | 3/2003 | Jang | .................... | H01M 10/482 324/430 |

* cited by examiner

*Primary Examiner* — Douglas X Rodriguez
*Assistant Examiner* — Trung Q Nguyen
(74) *Attorney, Agent, or Firm* — Winston Hsu

(57) ABSTRACT

A method includes recording a branch current and a terminal voltage of each of two parallel connected cells of a battery pack during the battery pack being switched from a charging or discharging state through a rest state to a balance state, to obtain an internal resistance of each cell, and an open-circuit voltage (OCV) and a state of charge (SOC) of the battery pack in the balance state, to obtain an OCV and a SOC of each cell just before the battery pack is switched to the rest state; and obtaining an aging differential index according to the SOC of each cell just before the battery pack is switched to the rest state, the branch current of each cell just after the battery pack is switched to the rest state, and a rated capacity of the battery pack, to determine a relative aging level of the two cells.

10 Claims, 14 Drawing Sheets

METHOD OF DETERMINING AN AGING DIFFERENCE OF A PLURALITY OF BATTERY CELLS CONNECTED IN PARALLEL OF A BATTERY PACK AND RELATED BATTERY DIAGNOSING SYSTEM

BACKGROUND OF THE INVENTION

1. Field of the Invention

The present invention relates to a battery diagnosis method and a related battery diagnosis system, and more specifically, to a battery diagnosis method of determining an aging difference of a plurality of battery cells connected in parallel of a battery pack and a related battery diagnosing system.

2. Description of the Prior Art

With advancement of the technology and development of the society, electric energy has gradually become the mainstream energy source. Energy storage devices that can store electric energy are widely used in different equipment. Currently, in order to improve flexibility of use, a battery pack which includes multiple battery cells connected in series or parallel, is the most common energy storage device. However, the battery pack cannot have the identical battery cells connected in parallel, and the battery cells have different parameters because of a manufacturing error. Therefore, after a period of using time, a degradation level of a performance of each of the battery cells, i.e., an aging of each of the battery cells, connected in parallel cannot be the same. It may cause a circulating current between the battery cells of the battery pack due to an aging difference of the battery cells, which accelerate an aging speed of the battery cells and/or the entire battery pack.

SUMMARY OF THE INVENTION

Therefore, it is an objective of the present invention to provide a method of determining an aging difference of a plurality of battery cells connected in parallel of a battery pack and a related battery diagnosing system for solving the aforementioned problem.

In order to achieve the aforementioned objective, the present invention discloses a method of determining an aging difference of a plurality of battery cells connected in parallel of a battery pack. The method includes measuring and recording a branch circuit and a terminal voltage of each of the plurality of battery cells at different time points during a period that the battery pack is switched from a charging state or a discharging state to a balancing state through a resting state; obtaining an internal resistance of each of the plurality of battery cells according to a variation of the terminal voltage of each of the plurality of battery cells and a variation of the branch circuit of each of the plurality of battery cells between two adjacent time points before and after the battery pack is switched from the charging state or the discharging state to the resting state; obtaining a balancing open-circuit voltage of the battery pack according to the terminal voltage of each of the plurality of battery cells when the battery pack is in the balancing state; obtaining a balancing state of charge of the battery pack according to the balancing open-circuit voltage; obtaining at least one relation of a plurality of open-circuit voltages of the plurality of battery cells at the time point before the battery pack is switched from the charging state or the discharging state to the resting state according to the internal resistance of each of the plurality of battery cells and the branch circuit of each of the plurality of battery cells at the time point before the battery pack is switched from the charging state or the discharging state to the resting state; obtaining a state of charge of each of the plurality of battery cells at the time point before the battery pack is switched from the charging state or the discharging state to the resting state according to the plurality of open-circuit voltages of the plurality of battery cells and the balancing state of charge; obtaining an aging differential index of two battery cells of the plurality of battery cells according to the state of charge of each of the plurality of battery cells at the time point before the battery pack is from the charging state or the discharging state to the resting state and the branch current of each of the plurality of battery cells at the time point after the battery pack is switched from the charging state or the discharging state to the resting state; and determining a relative aging level of the two battery cells of the plurality of battery cells according to the aging differential index.

According to an embodiment of the present invention, measuring and recording the branch circuit and the terminal voltage of each of the plurality of battery cells at the different time points during the period that the battery pack is switched from the charging state or the discharging state to the balancing state through the resting state includes measuring and recording the branch circuit and the terminal voltage of each of the plurality of battery cells at the different time points and at a predetermined sampling frequency during the period that the battery pack is switched from the charging state or the discharging state to the balancing state through the resting state.

According to an embodiment of the present invention, the predetermined sampling frequency is equal to or greater than 1 Hertz.

According to an embodiment of the present invention, the method further includes obtaining a second aging level index of a second battery cell of the two battery cells of the plurality of battery cells according to the aging differential index and a first aging level index of a first battery cell of the two battery cells of the plurality of battery cells.

According to an embodiment of the present invention, a first aging level of a first battery cell of the two battery cells of the plurality of battery cells is equal to a second aging level of a second battery cell of the two battery cells of the plurality of battery cells when the aging differential index is equal to zero. The first aging level of the first battery cell of the two battery cells of the plurality of battery cells is less than the second aging level of the second battery cell of the two battery cells of the plurality of battery cells when the aging differential index is less than zero, and the first aging level of the first battery cell of the two battery cells of the plurality of battery cells is greater than the second aging level of the second battery cell of the two battery cells of the plurality of battery cells when the aging differential index is greater than zero.

Furthermore, the present invention further discloses a battery diagnosing system capable of determining an aging difference of a plurality of battery cells connected in parallel of a battery pack. The battery diagnosing system includes a measuring device, an internal resistance calculating device, a first open-circuit voltage calculating device, a first state of charge calculating device, a second open-circuit voltage calculating device, a second state of charge calculating device, an aging difference calculating device and an aging level determining device. The measuring device is configured to measure and record a branch circuit and a terminal voltage of each of the plurality of battery cells at different time points during a period that the battery pack is switched from a charging state or a discharging state to a balancing state through a resting state. The internal resistance calculating device is configured to obtain an internal resistance of each of the plurality of battery cells according to a variation of the terminal voltage of each of the plurality of battery cells and a variation of the branch circuit of each of the plurality of battery cells between two adjacent time points before and after the battery pack is switched from the charging state or the discharging state to the resting state. The first open-circuit voltage calculating device is configured to obtain a balancing open-circuit voltage of the battery pack according to the terminal voltage of each of the plurality of battery cells when the battery pack is in the balancing state. The first state of charge calculating device is configured to obtain a balancing state of charge of the battery pack according to the balancing open-circuit voltage. The second open-circuit voltage calculating device is configured to obtain at least one relation of a plurality of open-circuit voltages of the plurality of battery cells at the time point before the battery pack is switched from the charging state or the discharging state to the resting state according to the internal resistance of each of the plurality of battery cells and the branch circuit of each of the plurality of battery cells at the time point before the battery pack is switched from the charging state or the discharging state to the resting state. The second state of charge calculating device is configured to obtain a state of charge of each of the plurality of battery cells at the time point before the battery pack is switched from the charging state or the discharging state to the resting state according to the plurality of open-circuit voltages of the plurality of battery cells and the balancing state of charge. The aging difference calculating device is configured to obtain an aging differential index of two battery cells of the plurality of battery cells according to the state of charge of each of the plurality of battery cells at the time point before the battery pack is from the charging state or the discharging state to the resting state and the branch current of each of the plurality of battery cells at the time point after the battery pack is switched from the charging state or the discharging state to the resting state. The aging level determining device is configured to determine a relative aging level of the two battery cells of the plurality of battery cells according to the aging differential index.

According to an embodiment of the present invention, the measuring device is configured to measure and record the branch circuit and the terminal voltage of each of the plurality of battery cells at the different time points and at a predetermined sampling frequency during the period that the battery pack is switched from the charging state or the discharging state to the balancing state through the resting state.

According to an embodiment of the present invention, the predetermined sampling frequency is equal to or greater than 1 Hertz.

According to an embodiment of the present invention, the battery diagnosing system further includes an aging index calculating device configured to obtain a second aging level index of a second battery cell of the two battery cells of the plurality of battery cells according to the aging differential index and a first aging level index of a first battery cell of the two battery cells of the plurality of battery cells.

According to an embodiment of the present invention, a first aging level of a first battery cell of the two battery cells of the plurality of battery cells is equal to a second aging level of a second battery cell of the two battery cells of the plurality of battery cells when the aging differential index is equal to zero. The first aging level of the first battery cell of the two battery cells of the plurality of battery cells is less than the second aging level of the second battery cell of the two battery cells of the plurality of battery cells when the aging differential index is less than zero, and the first aging level of the first battery cell of the two battery cells of the plurality of battery cells is greater than the second aging level of the second battery cell of the two battery cells of the plurality of battery cells when the aging differential index is greater than zero.

In summary, the present invention can determine the aging difference of the two battery cells connected in parallel of the battery pack, which allows a user to recognize and replace the battery cell which has the greater aging level without replacing the entire battery pack. Therefore, the present invention can not only reduce a negative impact caused by the excessive aging difference but also prevent waste of resource.

These and other objectives of the present invention will no doubt become obvious to those of ordinary skill in the art after reading the following detailed description of the preferred embodiment that is illustrated in the various figures and drawings.

DETAILED DESCRIPTION

The term "couple" is intended to mean either an indirect or direct electrical/mechanical connection. Thus, if a first device is coupled to a second device, that connection may be through a direct electrical/mechanical connection, or through an indirect electrical/mechanical connection via other devices and connections. The term "charging state" is intended to mean a state that a voltage source is coupled to a battery pack and charging the battery pack. The term "discharging state" is intended to mean a state that a load source is coupled to the battery pack and discharging the battery pack. The term "resting state" is intended to mean a state that the voltage source is not charging the battery pack anymore, or the load source is not discharging the battery pack anymore, but there is a circulating current in the battery pack due to mismatch of states or physical quantities of battery cells of the battery pack. The term "balancing state" is intended to mean a state that there is no circulating current in the battery pack.

Figure 1:
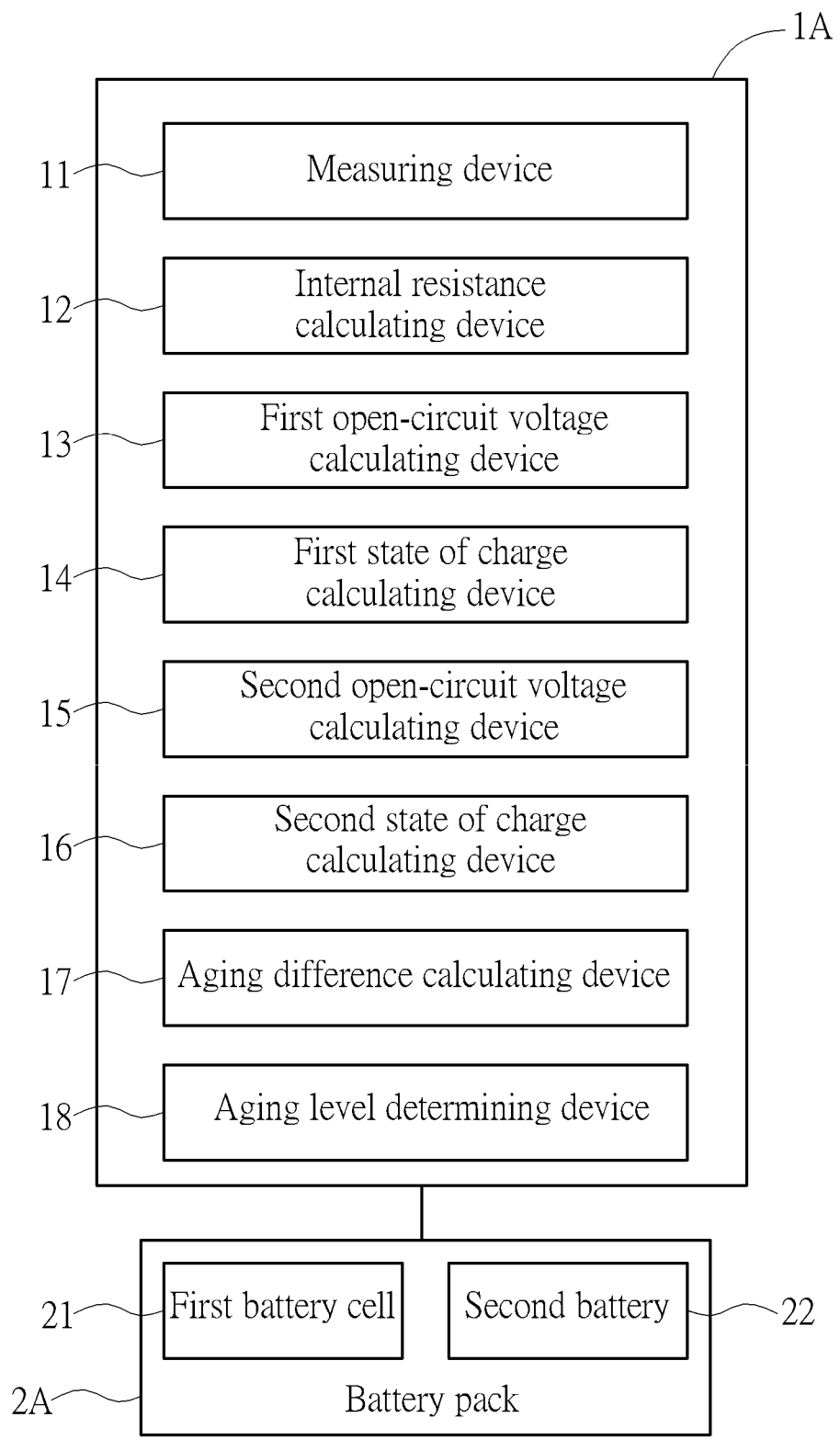
FIG. 1 is a functional block diagram of a battery diagnosing system according to a first embodiment of the present invention.
Figure 2A:
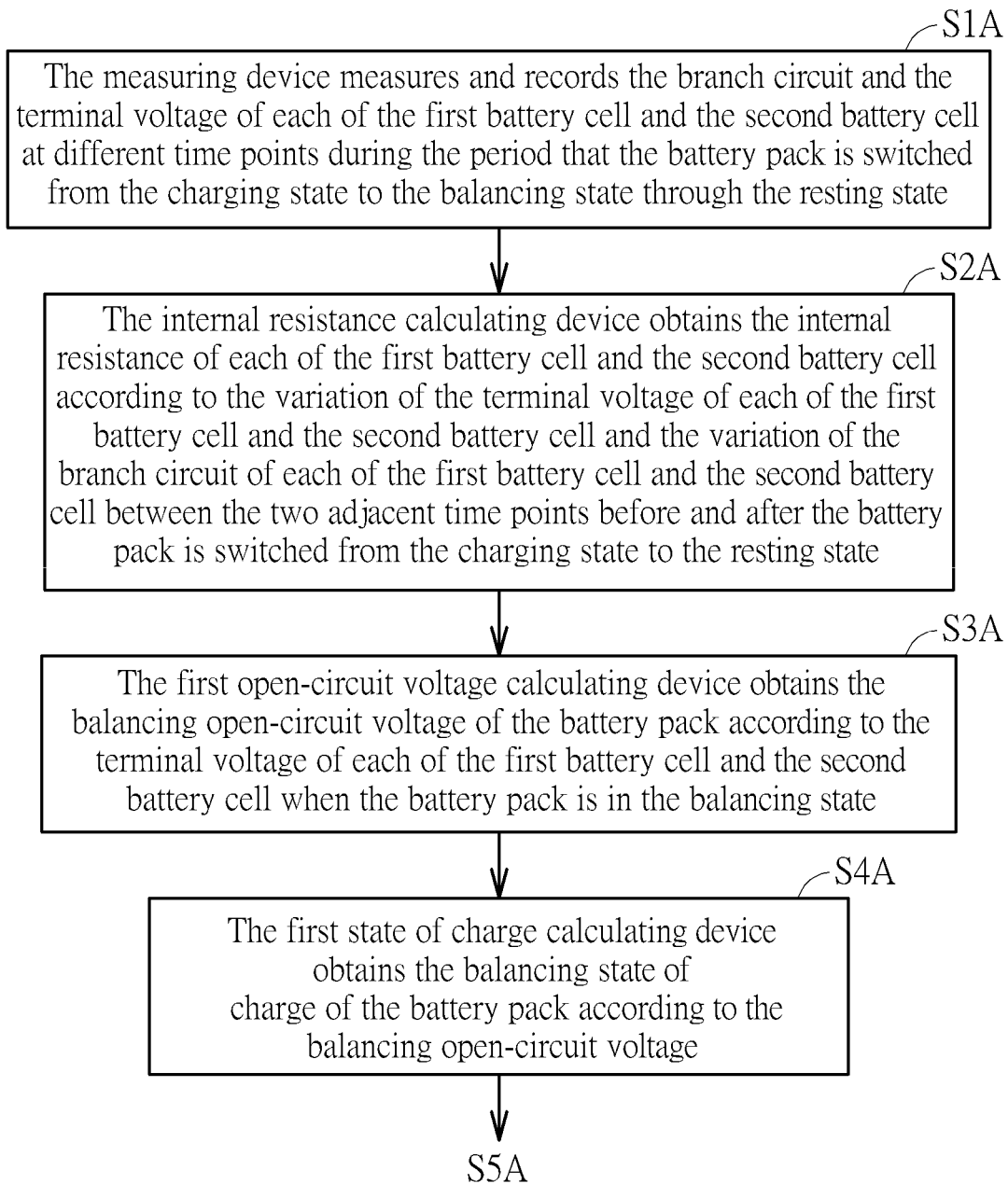
FIG. 2A and FIG. 2B are flow chart diagrams of a method of determining an aging difference of a first battery cell and a second battery cell connected in parallel of a battery pack executed by the battery diagnosing system according to the first embodiment of the present invention.
Figure 2B:
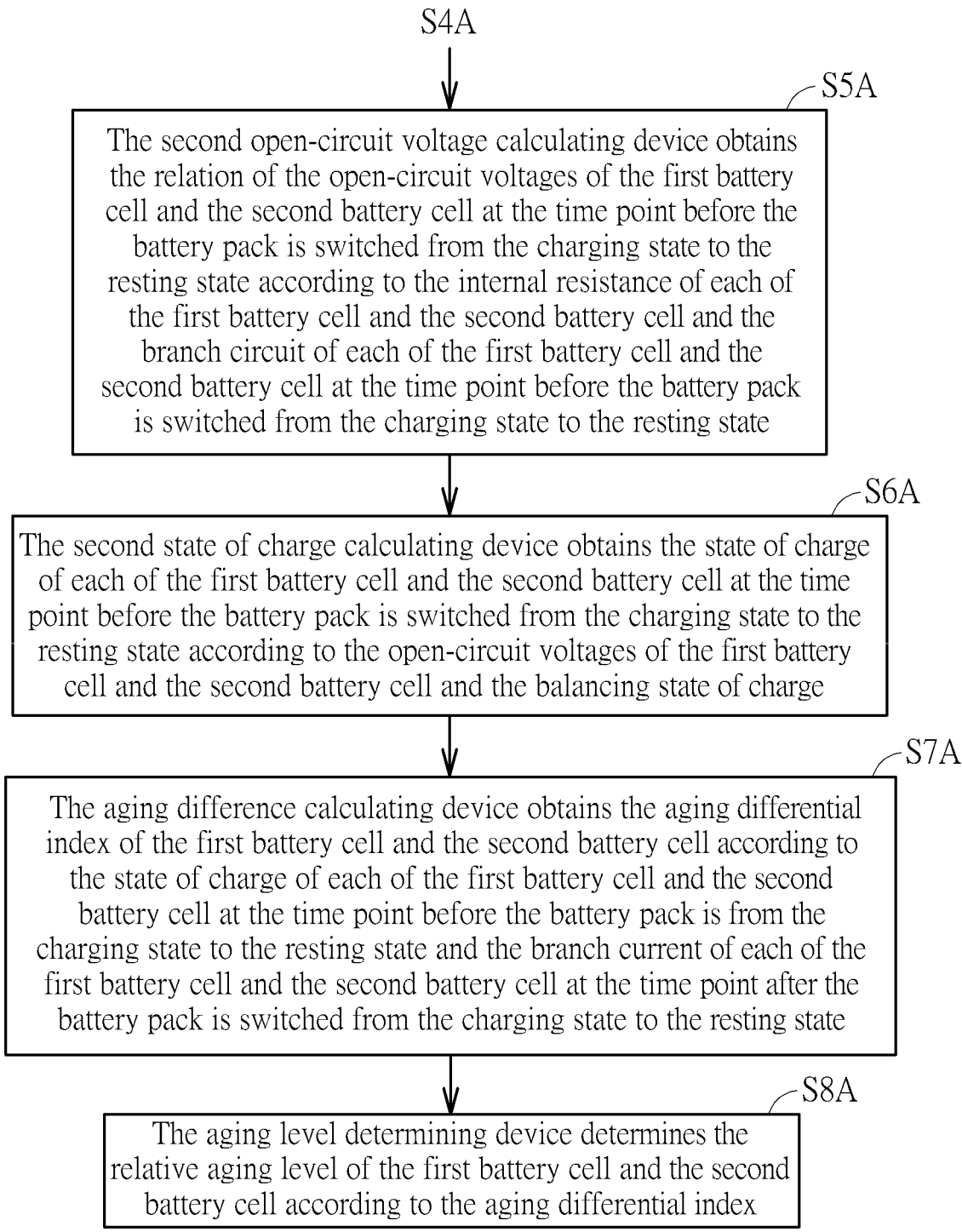
Figure 3:
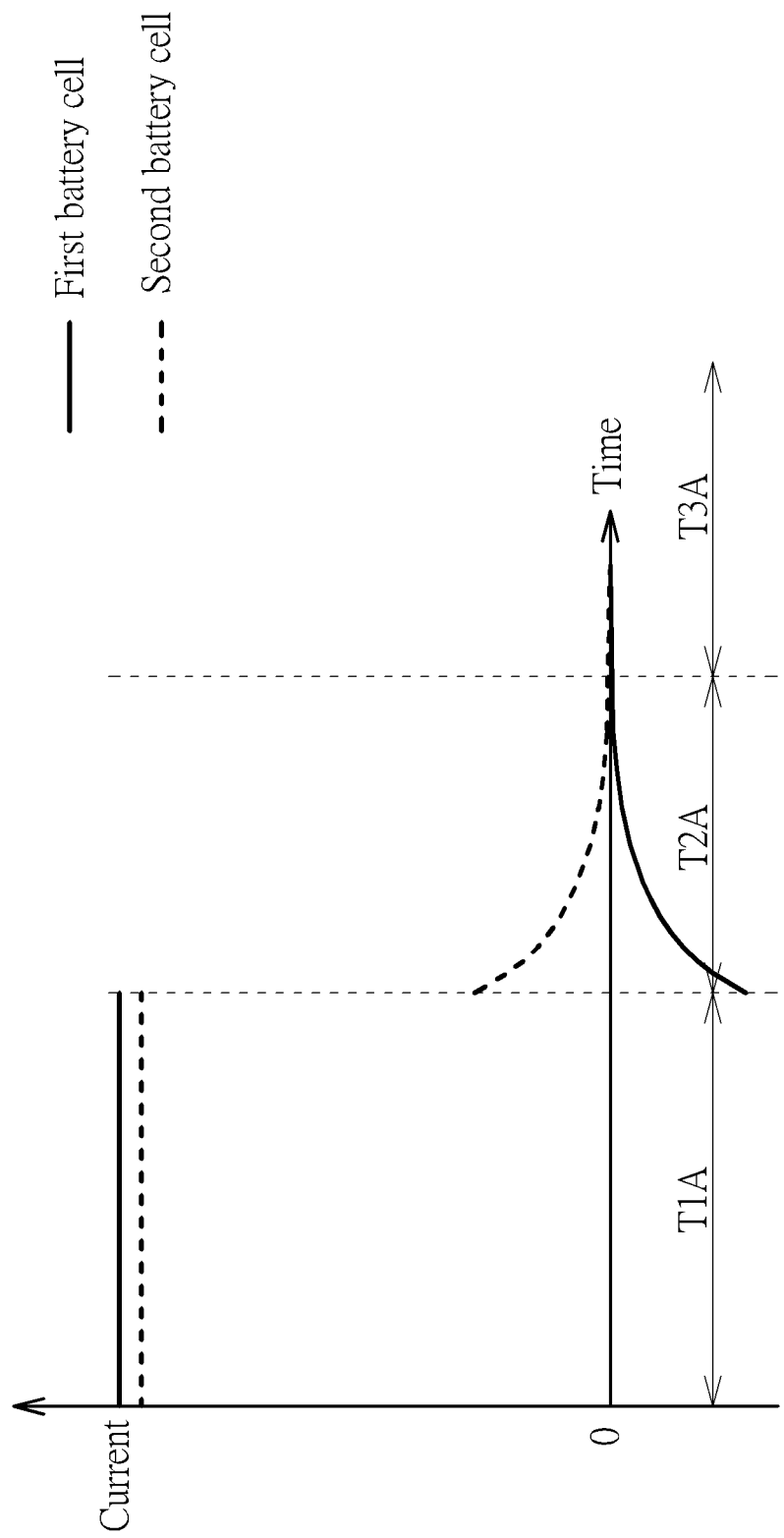
FIG. 3 is a current-time diagram of the battery pack according to the first embodiment.

Please refer to FIG. 1 to FIG. 3. FIG. 1 is a functional block diagram of a battery diagnosing system 1A according to a first embodiment of the present invention. FIG. 2A and FIG. 2B are flow chart diagrams of a method of determining an aging difference of a first battery cell 21 and a second battery cell 22 connected in parallel of a battery pack 2A executed by the battery diagnosing system 1A according to the first embodiment of the present invention. FIG. 3 is a current-time diagram of the battery pack 2A according to the first embodiment. As shown in FIG. 1 to FIG. 3, the battery diagnosing system 1A is configured to be coupled to the battery pack 2A for determining the aging difference of the first battery cell 21 and the second battery cell 22. The battery diagnosing system 1A includes a measuring device 11, an internal resistance calculating device 12, a first open-circuit voltage calculating device 13, a first state of charge calculating device 14, a second open-circuit voltage calculating device 15, a second state of charge calculating device 16, an aging difference calculating device 17 and an aging level determining device 18. The measuring device 11, the internal resistance calculating device 12, the first open-circuit voltage calculating device 13, the first state of charge calculating device 14, the second open-circuit voltage calculating device 15, the second state of charge calculating device 16, the aging difference calculating device 17 and the aging level determining device 18 can be directly or indirectly coupled to each other for signal, data and/or electricity transmission.

The measuring device 11 is configured to measure and record a branch circuit and a terminal voltage of each of the first battery cell 21 and the second battery cell 22 at different time points during a period that the battery pack 2A is switched from a charging state to a balancing state through a resting state. The internal resistance calculating device 12 is configured to obtain an internal resistance of each of the first battery cell 21 and the second battery cell 22 according to a variation of the terminal voltage of each of the first battery cell 21 and the second battery cell 22 and a variation of the branch circuit of each of the first battery cell 21 and the second battery cell 22 between two adjacent time points before and after the battery pack 2A is switched from the charging state to the resting state. The first open-circuit voltage calculating device 13 is configured to obtain a balancing open-circuit voltage of the battery pack 2A according to the terminal voltage of each of the first battery cell 21 and the second battery cell 22 when the battery pack 2A is in the balancing state. The first state of charge calculating device 14 is configured to obtain a balancing state of charge of the battery pack 2A according to the balancing open-circuit voltage. The second open-circuit voltage calculating device 15 is configured to obtain a relation of open-circuit voltages of the first battery cell 21 and the second battery cell 22 at the time point before the battery pack 2A is switched from the charging state to the resting state according to the internal resistance of each of the first battery cell 21 and the second battery cell 22 and the branch circuit of each of the first battery cell 21 and the second battery cell 22 at the time point before the battery pack 2A is switched from the charging state to the resting state. The second state of charge calculating device 16 is configured to obtain a state of charge of each of the first battery cell 21 and the second battery cell 22 at the time point before the battery pack 2A is switched from the charging state to the resting state according to the open-circuit voltages of the first battery cell 21 and the second battery cell 22 and the balancing state of charge. The aging difference calculating device 17 is configured to obtain an aging differential index of the first battery cell 21 and the second battery cell 22 according to the state of charge of each of the first battery cell 21 and the second battery cell 22 at the time point before the battery pack 2A is switched from the charging state to the resting state and the branch current of each of the first battery cell 21 and the second battery cell 22 at the time point after the battery pack 2A is switched from the charging state to the resting state. The aging level determining device 18 is configured to determine a relative aging level of the first battery cell 21 and the second battery cell 22 according to the aging differential index.

As shown in FIG. 2A and FIG. 2B, the method of determining the aging difference of the first battery cell 21 and the second battery cell 22 connected in parallel of the battery pack 2A executed by the battery diagnosing system 1A includes the following steps:

Step S1A: The measuring device 11 measures and records the branch circuit and the terminal voltage of each of the first battery cell 21 and the second battery cell 22 at different time points during the period that the battery pack 2A is switched from the charging state to the balancing state through the resting state;

Step S2A: The internal resistance calculating device 12 obtains the internal resistance of each of the first battery cell 21 and the second battery cell 22 according to the variation of the terminal voltage of each of the first battery cell 21 and the second battery cell 22 and the variation of the branch circuit of each of the first battery cell 21 and the second battery cell 22 between the two adjacent time points before and after the battery pack 2A is switched from the charging state to the resting state;

Step S3A: The first open-circuit voltage calculating device 13 obtains the balancing open-circuit voltage of the battery pack 2A according to the terminal voltage of each of the first battery cell 21 and the second battery cell 22 when the battery pack 2A is in the balancing state;

Step S4A: The first state of charge calculating device 14 obtains the balancing state of charge of the battery pack 2A according to the balancing open-circuit voltage;

Step S5A: The second open-circuit voltage calculating device 15 obtains the relation of the open-circuit voltages of the first battery cell 21 and the second battery cell 22 at the time point before the battery pack 2A is switched from the charging state to the resting state according to the internal resistance of each of the first battery cell 21 and the second battery cell 22 and the branch circuit of each of the first battery cell 21 and the second battery cell 22 at the time point before the battery pack 2A is switched from the charging state to the resting state;

Step S6A: The second state of charge calculating device 16 obtains the state of charge of each of the first battery cell 21 and the second battery cell 22 at the time point before the battery pack 2A is switched from the charging state to the resting state according to the open-circuit voltages of the first battery cell 21 and the second battery cell 22 and the balancing state of charge;

Step S7A: The aging difference calculating device 17 obtains the aging differential index of the first battery cell 21 and the second battery cell 22 according to the state of charge of each of the first battery cell 21 and the second battery cell 22 at the time point before the battery pack 2A is from the charging state to the resting state and the branch current of each of the first battery cell 21 and the second battery cell 22 at the time point after the battery pack 2A is switched from the charging state to the resting state; and Step S8A: The aging level determining device 18 determines the relative aging level of the first battery cell 21 and the second battery cell 22 according to the aging differential index.

Detailed description for the steps is provided as follows. In step S1A, forgetting the relative aging level of the first battery cell 21 and the second battery cell 22 connected in parallel of the battery pack 2A, the charging of the battery pack 2A can be stopped by removing or disconnecting a voltage source from the battery pack 2A charged by the voltage source, so that the battery pack 2A is switched from the charging state to the resting state. Afterwards, the battery pack 2A can be stood for a while, e.g., at least one hour, so that the battery pack 2A can be further switched from the resting state to a balancing state. A relation of current and time of each of the first battery cell 21 and the second battery cell 22 when the battery pack 2A is switched from the charging state to the balancing state through the resting state is illustrated in FIG. 3. In a first time period T1A, the battery pack 2A is in the charging state. At this moment, the voltage source is charging the first battery cell 21 and the second battery cell 22. In a second time period T2A, the battery pack 2A is in the resting state. At this moment, there is a circulating current in the battery pack 2A, and the branch currents of the first battery cell 21 and the second battery cell 22 are not equal to zero. In a third time period T3A, the battery pack 2A is in the balancing state. At this moment, there is no circulating current in the battery pack 2A, and the branch currents of the first battery cell 21 and the second battery cell 22 are equal to zero. During a process of that the battery pack 2A is switched from the charging state to the balancing state through the resting state, the measuring device 11 measures and records the branch circuit and the terminal voltage of each of the first battery cell 21 and the second battery cell 22 at different time points. For example, the branch circuit and the terminal voltage of each of the first battery cell 21 and the second battery cell 22 at different time points can be illustrated in following Table 1. Preferably, the measuring device 11 can measure and record the branch circuit and the terminal voltage of each of the first battery cell 21 and the second battery cell 22 in a predetermined sampling frequency which is equal to or greater than 1 Hertz.

TABLE 1

| Time point sequence | State | Branch current of first battery cell | Branch current of second battery cell | Terminal voltage of first battery cell | Terminal voltage of second battery cell |
| --- | --- | --- | --- | --- | --- |
| 1 | Charging | 1.507 | 1.493 | 3.987 | 3.969 |
| 2 | Charging | 1.507 | 1.493 | 3.987 | 3.969 |
| 3 | Resting | −0.173 | 0.173 | 3.893 | 3.890 |
| 4 | Resting | −0.121 | 0.121 | 3.892 | 3.889 |
| ... | ... | ... | ... | ... | ... |
| 3600 | Balancing | 0 | 0 | 3.872 | 3.872 |

Furthermore, in step S2A, the internal resistance calculating device 12 obtains the internal resistance of each of the first battery cell 21 and the second battery cell 22 according to the variation of the terminal voltage of each of the first battery cell 21 and the second battery cell 22 and the variation of the branch circuit of each of the first battery cell 21 and the second battery cell 22 between the two adjacent time points before and after the battery pack 2A is switched from the charging state to the resting state.

Specifically, taking Table 1 of this embodiment as an example, the branch circuit and the terminal voltage of the first battery cell 21 at the time point before the battery pack 2A is switched from the charging state to the resting state are 1.507 amps and 3.987 volts, respectively. The branch circuit and the terminal voltage of the second battery cell 22 at the time point before the battery pack 2A is switched from the charging state to the resting state are 1.493 amps and 3.969 volts, respectively. The branch circuit and the terminal voltage of the first battery cell 21 at the time point after the battery pack 2A is switched from the charging state to the resting state are −0.173 amps and 3.893 volts, respectively. The branch circuit and the terminal voltage of the second battery cell 22 at the time point after the battery pack 2A is switched from the charging state to the resting state are 0.173 amps and 3.890 volts, respectively. Therefore, the internal resistance calculating device 12 can determine that a difference between the terminal voltages of the first battery cell 21 at the time points before and after the battery pack 2A is switched from the charging state to the resting state is 0.094 volts, a difference between the branch currents of the first battery cell 21 at the time points before and after the battery pack 2A is switched from the charging state to the resting state is 1.680 amps, a difference between the terminal voltages of the second battery cell 22 at the time points before and after the battery pack 2A is switched from the charging state to the resting state is 0.079 volts, and a difference between the branch currents of the second battery cell 22 at the time points before and after the battery pack 2A is switched from the charging state to the resting state is 1.320 amps.

Afterwards, the internal resistance calculating device 12 can divide the difference between the terminal voltages of the first battery cell 21 at the time points before and after the battery pack 2A is switched from the charging state to the resting state by the difference between the branch currents of the first battery cell 21 at the time points before and after the battery pack 2A is switched from the charging state to the resting state to determine that the internal resistance of the first battery cell 21 is about 0.056 ohm. Furthermore, the internal resistance calculating device 12 can divide the difference between the terminal voltages of the second battery cell 22 at the time points before and after the battery pack 2A is switched from the charging state to the resting state by the difference between the branch currents of the second battery cell 22 at the time points before and after the battery pack 2A is switched from the charging state to the resting state to determine that the internal resistance of the second battery cell 22 is about 0.060 ohm.

In step S3A, the first open-circuit voltage calculating device 13 obtains the balancing open-circuit voltage of the battery pack 2A according to the terminal voltage of each of the first battery cell 21 and the second battery cell 22 when the battery pack 2A is in the balancing state.

Specifically, taking Table 1 of this embodiment as an example, when the battery pack 2A is in the balancing state, the terminal voltages of the first battery cell 21 and the second battery cell 22 are equal to each other, which are 3.872 volts. At this moment, the branch currents of the first battery cell 21 and the second battery cell 22 are zero. Therefore, the first open-circuit voltage calculating device 13 can determine the balancing open-circuit voltage of the battery pack 2A according to the terminal voltage of each of the first battery cell 21 and the second battery cell 22 when the battery pack 2A is in the balancing state. In other words, the first open-circuit voltage calculating device 13 can determine that the balancing open-circuit voltage of the battery pack 2A is 3.872 volts.

In step S4A, the first state of charge calculating device 14 obtains the balancing state of charge of the battery pack 2A according to the balancing open-circuit voltage.

Specifically, in this embodiment, the first state of charge calculating device 14 can determine that the balancing state of charge of the battery pack 2A is 49.8% by substituting the balancing open-circuit voltage into a query form or a relational function corresponding to a relation of the open-circuit voltage and state of charge of the battery pack 2A.

In steps S5A and S6A, the second open-circuit voltage calculating device 15 obtains the relation of the open-circuit voltages of the first battery cell 21 and the second battery cell 22 at the time point before the battery pack 2A is switched from the charging state to the resting state according to the internal resistance of each of the first battery cell 21 and the second battery cell 22 and the branch circuit of each of the first battery cell 21 and the second battery cell 22 at the time point before the battery pack 2A is switched from the charging state to the resting state, and the second state of charge calculating device 16 obtains the state of charge of each of the first battery cell 21 and the second battery cell 22 at the time point before the battery pack 2A is switched from the charging state to the resting state according to the open-circuit voltages of the first battery cell 21 and the second battery cell 22 and the balancing state of charge.

Specifically, the second open-circuit voltage calculating device 15 can substitute the internal resistances of the first battery cell 21 and the second battery cell 22 and the branch currents of the first battery cell 21 and the second battery cell 22 at the time point before the battery pack 2A is switched from the charging state to the resting state into a terminal voltage equation, e.g., following Equation 1, to obtain the relation of the open-circuit voltages of the first battery cell 21 and the second battery cell 22 at the time point before the battery pack 2A is switched from the charging state to the resting state. Furthermore, the second state of charge calculating device 16 can assume the open-circuit voltages of the first battery cell 21 and the second battery cell 22 at the time point before the battery pack 2A is switched from the charging state to the resting state according to the relation of the open-circuit voltages of the first battery cell 21 and the second battery cell 22 at the time point before the battery pack 2A is switched from the charging state to the resting state and substitute the states of charge of the first battery cell 21 and the second battery cell 22 corresponding to the open-circuit voltages of the first battery cell 21 and the second battery cell 22 into a state of charge equation, e.g., following Equation 2. If the state of charge equation is not satisfied with the states of charge of the first battery cell 21 and the second battery cell 22, it means that the assumed open-circuit voltages of the first battery cell 21 and the second battery cell 22 at the time point before the battery pack 2A is switched from the charging state to the resting state are wrong and need to be reassumed until the state of charge equation is satisfied, so as to correctly obtain the open-circuit voltages of the first battery cell 21 and the second battery cell 22 at the time point before the battery pack 2A is switched from the charging state to the resting state.

$$U_1 + I_1 R_1 = U_2 + I_2 R_2 \quad \text{Equation 1}$$

$$\frac{SoC_1 + SoC_2}{2} = SoC_b \quad \text{Equation 2}$$

In aforementioned Equations 1 and 2, $U_1$ and $U_2$ are values of the open-circuit voltages of the first battery cell 21 and the second battery cell 22 at the time point before the battery pack 2A is switched from the charging state to the resting state. $I_1$ and $I_2$ are values of the branch currents of the first battery cell 21 and the second battery cell 22 at the time point before the battery pack 2A is switched from the charging state. $R_1$ and $R_2$ are values of the internal resistances the first battery cell 21 and the second battery cell 22. $SoC_b$ is a value of the balancing state of charge of the battery pack 2A. $SoC_1$ and $SoC_2$ are values of the states of charge of the first battery cell 21 and the second battery cell 22 at the time point before the battery pack 2A is switched from the charging state.

In an embodiment, by the aforementioned recursion, the second state of charge calculating device 16 can determine the states of charge of the first battery cell 21 and the second battery cell 22 at the time point before the battery pack 2A is switched from the charging state to the resting state are 50.2% and 49.4%, respectively. Detailedly, a relation between the open-circuit voltages of the first battery cell 21 and the second battery cell 22 at the time point before the battery pack 2A is switched from the charging state to the resting state, can be obtained by substituting the internal resistances of the first battery cell 21 and the second battery cell 22, which are determined to be about 0.056 ohm and 0.060 ohm respectively by the internal resistance calculating device 12, and the branch currents of the first battery cell 21 and the second battery cell 22 at the time point before the battery pack 2A is switched from the charging state to the resting state, which are measured to be 1.507 amps and 1.493 amps, into Equation 1. Afterwards, the open-circuit voltage of the second battery cell 22 at the time point before the battery pack 2A is switched from the charging state to the resting state, which is $U_2$, can be determined to be 3.898 volts by substituting the open-circuit voltage of the first battery cell 21 at the time point before the battery pack 2A is switched from the charging state to the resting state, which is $U_1$ and assumed to be 3.903 volts. Furthermore, the states of charge of the first battery cell 21 and the second battery cell 22 at the time point before the battery pack 2A is switched from the charging state, which are $SoC_1$ and $SoC_2$ respectively, can be determined to be 53.4% and 52.6% respectively according to the open-circuit voltages of the first battery cell 21 and second battery cell 22, which are $U_1$ and $U_2$ respectively, and the corresponding query form or the corresponding relational function of the open-circuit voltage and state of charge. Besides, the balancing state of charge of the battery pack 2A, which is $SoC_b$, can be determined to be 53% by substituting the states of charge of the first battery cell 21 and the second battery cell 22 at the time point before the battery pack 2A is switched from the charging state, which are $SoC_1$ and $SoC_2$ respectively, into Equation 2. Since the balancing state of charge of the battery pack 2A, which is $SoC_b$, is not equal to the balancing state of charge of the battery pack 2A, which is determined to be 49.8% by the first state of charge calculating device 14, the open-circuit voltage of the first battery cell 21 at the time point before the battery pack 2A is switched from the charging state to the resting state, i.e., $U_1$, should be re-assumed. In this embodiment, when the open-circuit voltage of the first battery cell 21 at the time point before the battery pack 2A is switched from the charging state to the resting state, i.e., $U_1$, is assumed to be 3.874 volts, the open-circuit voltage of the second battery cell 21 at the time point before the battery pack 2A is switched from the charging state to the resting state, i.e., $U_2$, is 3.869 volts, and the states of charge of the first battery cell 21 and the second battery cell 22 at the time point before the battery pack 2A is switched from the charging state, i.e., $SoC_1$ and $SoC_2$, are 50.2% and 49.4% respectively. Furthermore, by substituting the states of charge of the first battery cell 21 and the second battery cell 22 at the time point before the battery pack 2A is switched from the charging state, i.e., $SoC_1$ and $SoC_2$, into Equation 2, the balancing state of charge of the battery pack 2A, which is $SoC_b$, can be determined to be 49.8% and equal to the balancing state of charge of the battery pack 2A determined by the first state of charge calculating device 14. From the above, the open-circuit voltages of the first battery cell 21 and the second battery cell 22, i.e., $U_1$ and $U_2$, can be obtained correctly.

In steps S7A and S8A, the aging difference calculating device 17 obtains the aging differential index of the first battery cell 21 and the second battery cell 22 according to the state of charge of each of the first battery cell 21 and the second battery cell 22 at the time point before the battery pack 2A is from the charging state to the resting state and the branch current of each of the first battery cell 21 and the second battery cell 22 at the time point after the battery pack 2A is switched from the charging state to the resting state, and the aging level determining device 18 determines the relative aging level of the first battery cell 21 and the second battery cell 22 according to the aging differential index.

Specifically, in this embodiment, the aging difference calculating device 17 can substitute the states of charge of the first battery cell 21 and the second battery cell 22 at the time point before the battery pack 2A is switched from the charging state to the resting state and the branch currents of the first battery cell 21 and the second battery cell 22 at the time point after the battery pack 2A is switched from the charging state to the resting state into an aging difference equation, e.g., following Equation 3, to obtain the aging differential index. When the aging differential index is zero, the aging level determining device 18 can determine that a first aging level of the first battery cell 21 is equal to a second aging level of the second battery cell 22. When the aging differential index is less than zero, the aging level determining device 18 can determine that the first aging level of the first battery cell 21 is less than the second aging level of the second battery cell 22. When the aging differential index is greater than zero, the aging level determining device 18 can determine that the first aging level of the first battery cell 21 is greater the second aging level of the second battery cell 22.

$$\alpha_{12} = \frac{SoC_1 - SoC_2}{\mu \cdot \sum |I_n|} \qquad \text{Equation 3}$$

In aforementioned Equation 3, $\alpha_{12}$ is a value of the aging differential index. $SoC_1$ and $SoC_2$ are values of the states of charge of the first battery cell and the second battery cell at the time point before the battery pack 2A is switched from the charging state to the resting state. A value of $\mu$ is a constant. In is a value of the branch current of each of the first battery cell and the second battery cell at the time point after the battery pack 2A is switched from the charging state to the resting state, and a unit thereof is amp.

$\mu$ is configured to adjust a sign of $\alpha 12$ according to change of the state of the battery pack 2A. For example, when the battery pack 2A is switched from the charging state to the resting state, $\mu$ can be configured to $-1$. When the battery pack 2A is switched from the discharging state to the resting state, $\mu$ can be configured to $+1$. In this embodiment, $\mu$ can be configured to $-1$. The aging difference calculating device 17 can substitute the states of charge of the first battery cell 21 and the second battery cell 22 at the time point before the battery pack 2A is switched from the charging state to the resting state and the branch currents of the first battery cell 21 and the second battery cell 22 at the time point after the battery pack 2A is switched from the charging state to the resting state into the aging difference equation, e.g., following Equation 3, to determine that the aging differential index is $-2.312$%. Therefore, the aging level determining device 18 can determine that the first aging level of the first battery cell 21 is less than the second aging level of the second battery cell 22, so that the user can reasonably replace the second battery cell 22 according to a determination result of the aging level determining device 18.

Furthermore, it should be noticed that, in practical application, the measuring device can collect the terminal voltage and the branch current of each battery cell in a predetermined sampling frequency and define time points just before and after the voltage source stops charging the battery pack as the time points before and after the battery pack is switched from the charging state to the resting state. In this embodiment, the measuring device 11 can measure and record the terminal voltages and the branch currents of the first battery cell 21 and the second battery cell 22 in a predetermined sampling frequency of 1 Hertz for one hour to establish Table 1. The terminal voltages and the branch currents of the first battery cell 21 and the second battery cell 22 at the time point before the battery pack 2A is switched from the charging state to the resting state can be the terminal voltages and the branch currents just before stopping charging the battery pack 2A, i.e., the terminal voltages and the branch currents corresponding to the time point sequence 2. The terminal voltages and the branch currents of the first battery cell 21 and the second battery cell 22 at the time point after the battery pack 2A is switched from the charging state to the resting state can be the terminal voltages and the branch currents just after stopping charging the battery pack 2A, i.e., the terminal voltages and the branch currents corresponding to the time point sequence 3. The terminal voltages of the first battery cell 21 and the second battery cell 22 when the battery pack 2A is in the balancing state are the terminal voltages when there is no circulating current in the battery pack 2A, i.e., the terminal voltages corresponding to the time point sequence 3600. However, the present invention is not limited to this embodiment. The measuring device can only measure and record the terminal voltage and the branch current of each battery cell at the following three time points that includes a time point just before removing the voltage source, i.e., the time point before the battery pack is in the resting state, a time point just after removing the voltage source, i.e., the time point after the battery pack is in the resting state, and a time point after the batter pack is standing for at least one hour, i.e., the time point when the battery pack is in the balancing state.

Figure 4:
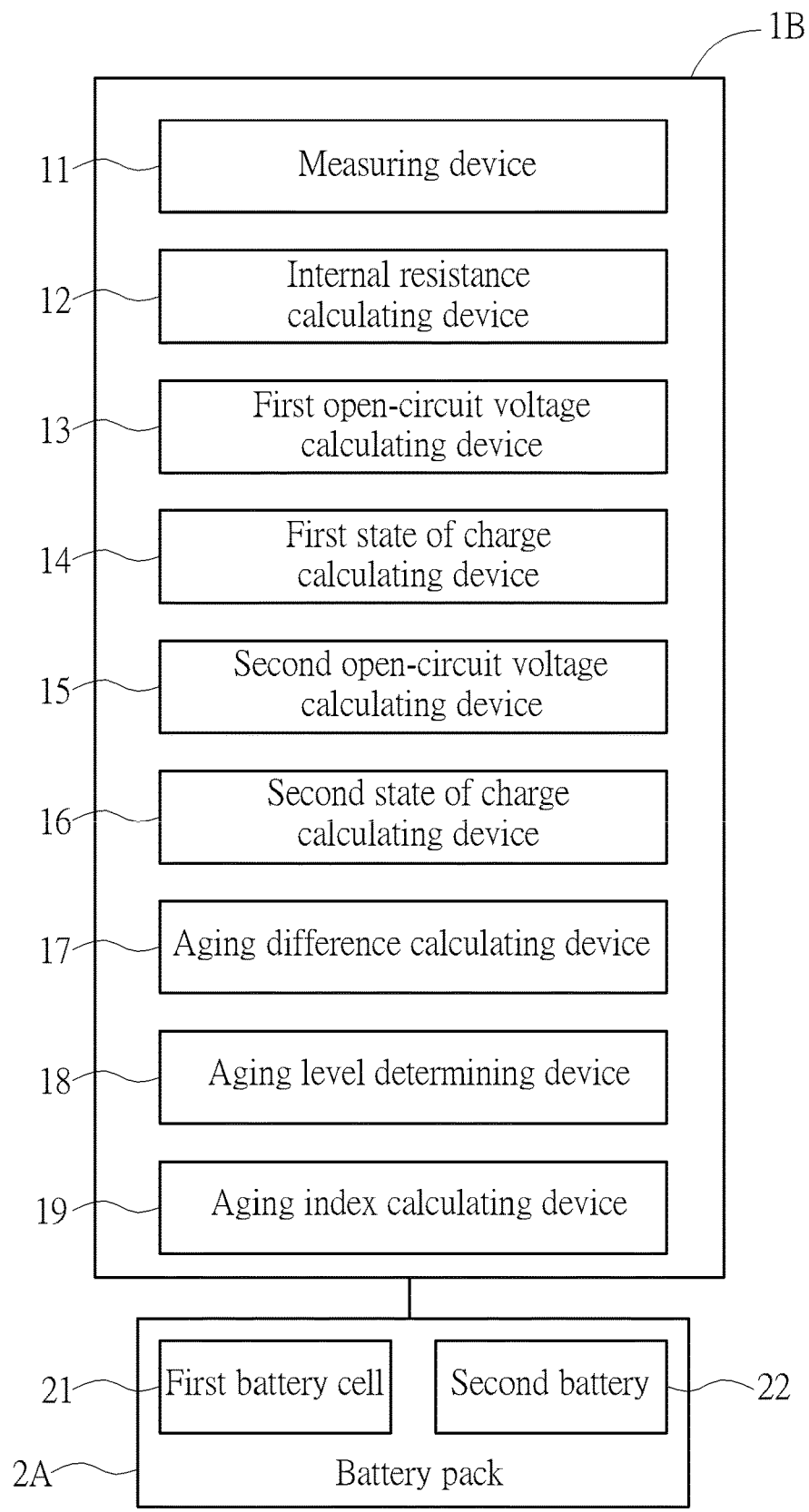
FIG. 4 is a functional block diagram of a battery diagnosing system according to a second embodiment of the present invention.
Figure 5A:
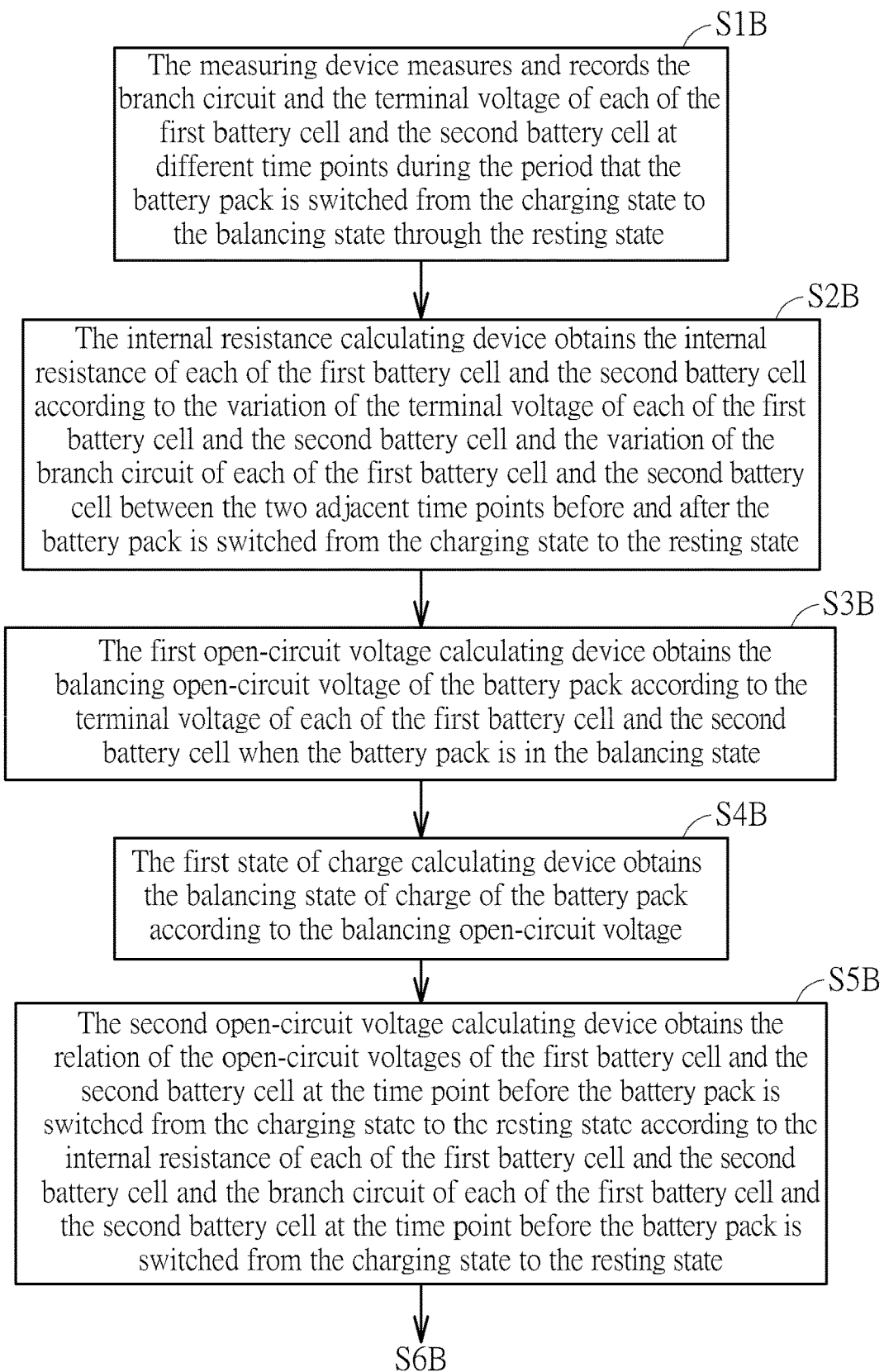
FIG. 5A and FIG. 5B are flow chart diagrams of a method of determining an aging difference of a first battery cell and a second battery cell connected in parallel of a battery pack executed by the battery diagnosing system according to the second embodiment of the present invention.
Figure 5B:
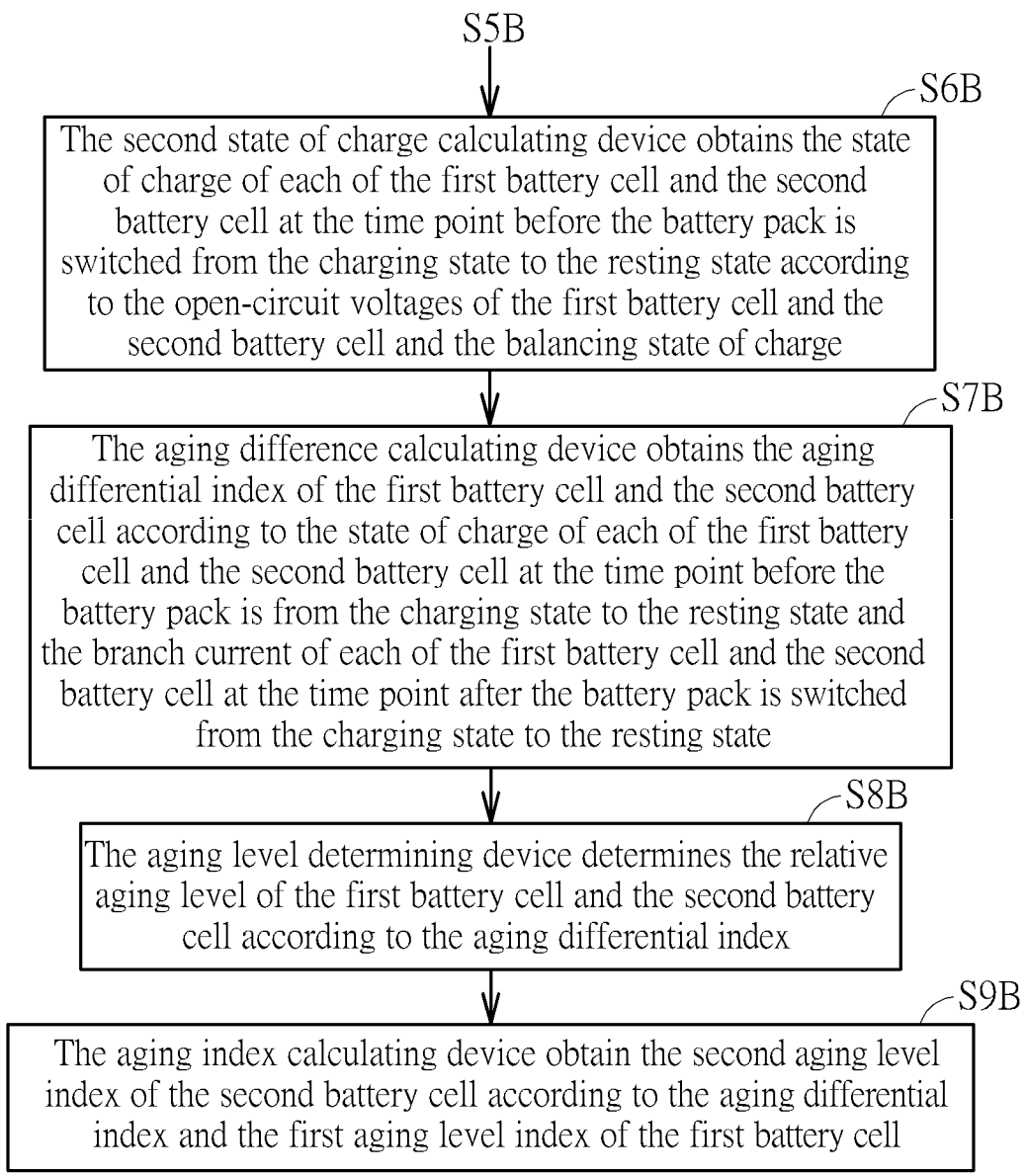

Please refer to FIG. 4, FIG. 5A and FIG. 5B. FIG. 4 is a functional block diagram of a battery diagnosing system 1B according to a second embodiment of the present invention. FIG. 5A and FIG. 5B are flow chart diagrams of a method of determining an aging difference of the first battery cell 21 and the second battery cell 22 connected in parallel of the battery pack 2A executed by the battery diagnosing system 1B according to the second embodiment of the present invention. As shown in FIG. 4, FIG. 5A and FIG. 5B, the battery diagnosing system 1B includes the measuring device 11, the internal resistance calculating device 12, the first open-circuit voltage calculating device 13, the first state of charge calculating device 14, the second open-circuit voltage calculating device 15, the second state of charge calculating device 16, the aging difference calculating device 17 and the aging level determining device 18. Structures and operational principles of the aforementioned devices and step S1B-S8B of this embodiment are similar to the first embodiment. Detailed description is omitted herein for simplicity. Different from the first embodiment, the battery diagnosing system 1B further includes an aging index calculating device 19 configured to obtain a second aging level index of the second battery cell 22 according to the aging differential index and a first aging level index of the first battery cell 21. In other words, in this embodiment, if the first aging level index of the first battery cell 21 is known, the battery diagnosing system 1B can obtain the second aging level index of the second battery cell 22 according to the aging differential index and the first aging level index of the first battery cell 21, as shown in step S9B of FIG. 5B. However, the present invention is not limited to this embodiment. In another embodiment, if the second aging level index of the second battery cell 22 is known, the battery diagnosing system can obtain the first aging level index of the first battery cell 21 according to the aging differential index and the second aging level index of the second battery cell 22.

Specifically, in this embodiment, if the first battery cell 21 is a brand new battery cell, i.e., the first aging level index of the first battery cell 21 is known to be 100%. The second aging level index of the second battery cell 22 can be obtained by substituting the aging differential index and the first aging level index of the first battery cell 21 into an aging level index equation, e.g., following Equation 4.

$$SoH_2 = SoH_1 + \alpha_{12} \cdot \beta$$  Equation 4

In aforementioned Equation 4, a value of $SoH_1$ is the first aging level index of the first battery cell 21. A value of $SoH_2$ is the second aging level index of the second battery cell 22. A value of $\alpha_{12}$ is the aging differential index.

$\beta$ is determined by type of the battery cell. In this embodiment, A value of $\beta$ can be configured to be 16.220. The second aging level index of the second battery cell 22 can be determined to be 62.5% by substituting the aging differential index and the first aging level index of the first battery cell 21 into the aging level index equation.

Furthermore, $\mu$ and $\beta$ can be obtained by two battery cells whose aging level index are known.

Figure 6:
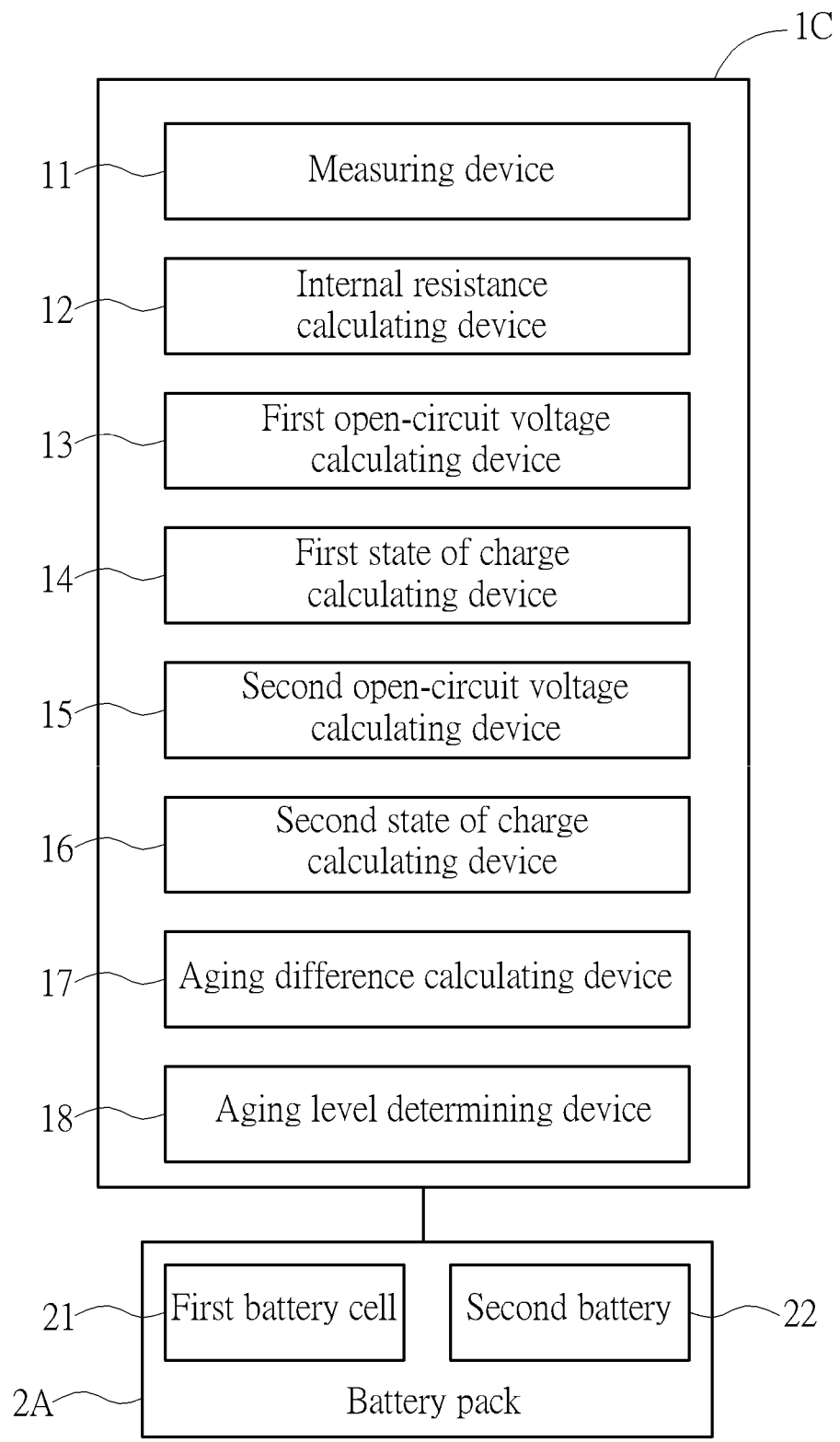
FIG. 6 is a functional block diagram of a battery diagnosing system according to a third embodiment of the present invention.
Figure 7A:
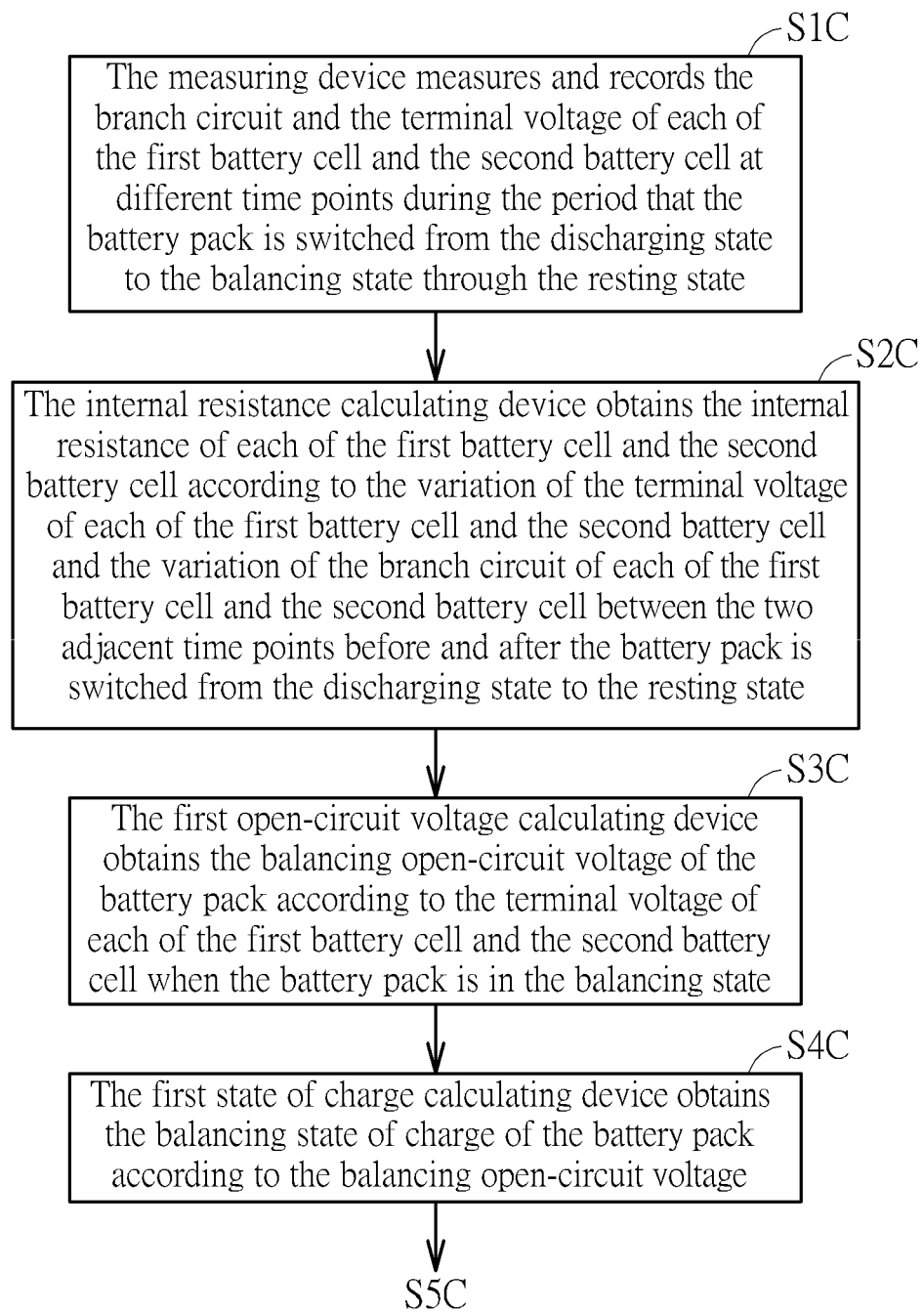
FIG. 7A and FIG. 7B are flow chart diagrams of a method of determining an aging difference of a first battery cell and a second battery cell connected in parallel of a battery pack executed by the battery diagnosing system according to the third embodiment of the present invention.
Figure 7B:
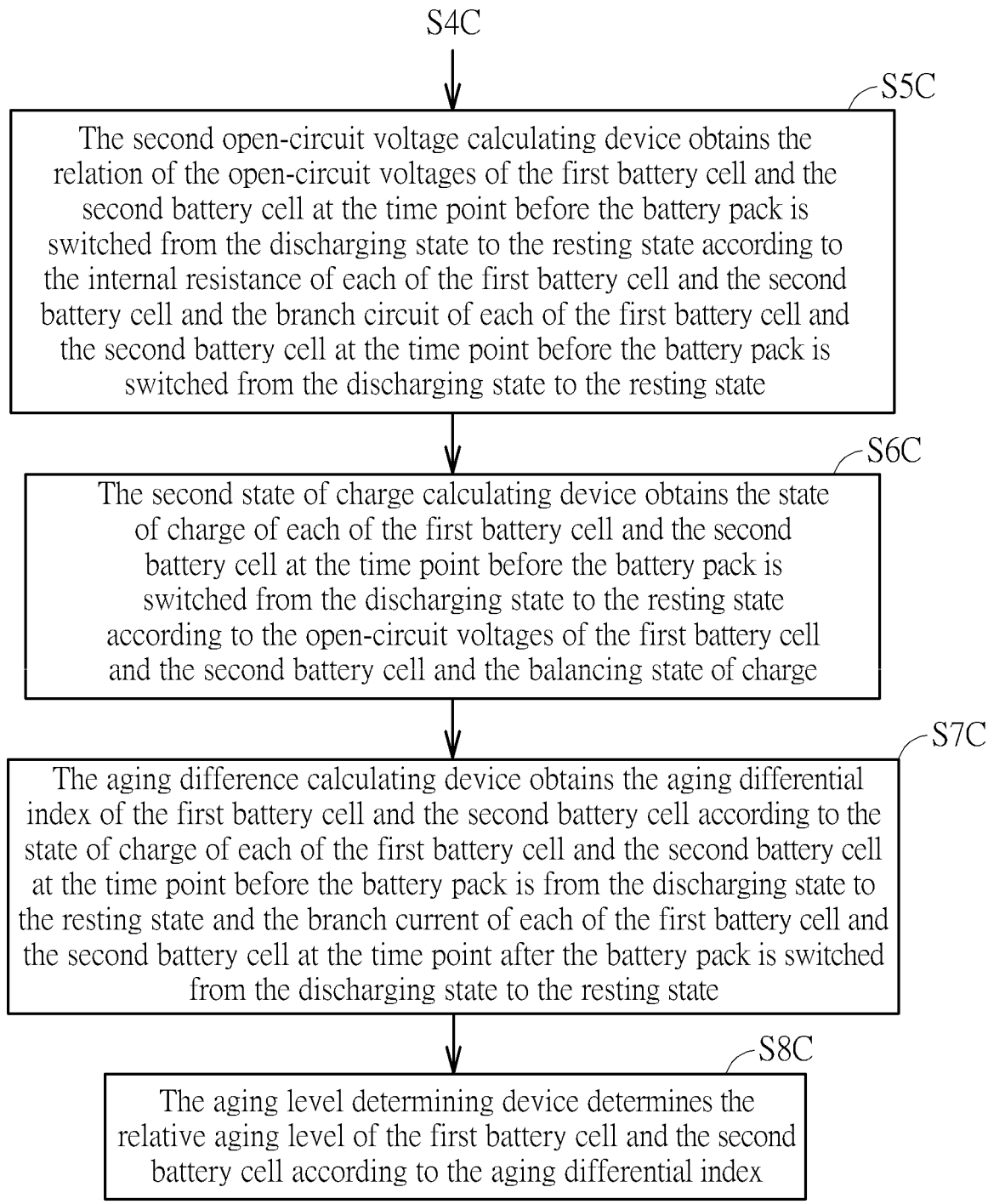
Figure 8:
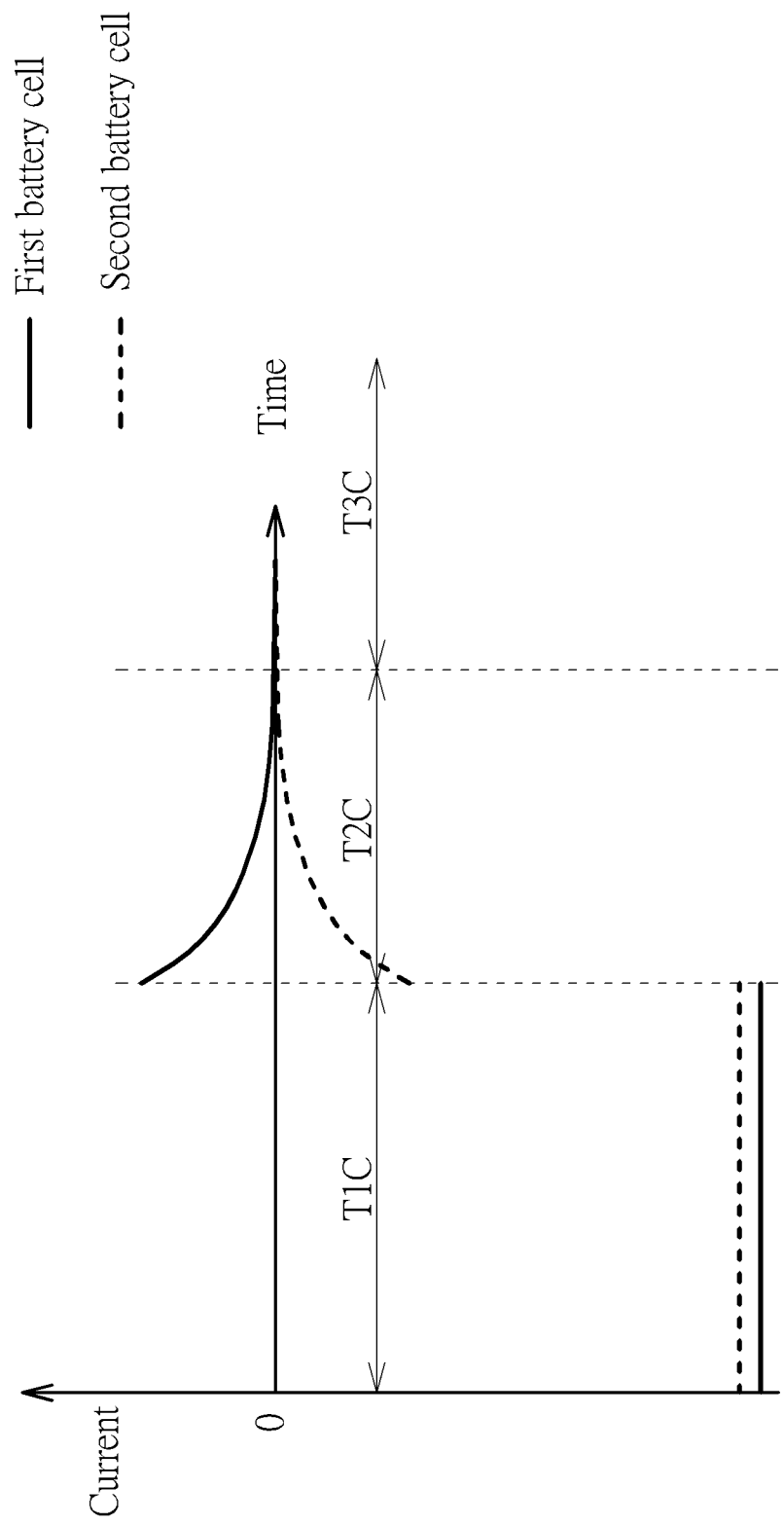
FIG. 8 is a current-time diagram of the battery pack according to the third embodiment.

Please refer to FIG. 6 to FIG. 8. FIG. 6 is a functional block diagram of a battery diagnosing system 1C according to a third embodiment of the present invention. FIG. 7A and FIG. 7B are flow chart diagrams of a method of determining the aging difference of the first battery cell 21 and the second battery cell 22 connected in parallel of the battery pack 2A executed by the battery diagnosing system 1C according to the third embodiment of the present invention. FIG. 8 is a current-time diagram of the battery pack 2A according to the third embodiment. As shown in FIG. 6 to FIG. 8, the battery diagnosing system 1C of this embodiment includes components/devices similar to the ones included in the battery diagnosing system 1A of the first embodiment. Different from the first embodiment, the measuring device 11 of this embodiment is configured to measure and record the branch circuit and the terminal voltage of each of the first battery cell 21 and the second battery cell 22 at different time points during a period that the battery pack 2A is switched from the discharging state to the balancing state through the resting stat. A relation of current and time of each of the first battery cell 21 and the second battery cell 22 when the battery pack 2A is switched from the discharging state to the balancing state through the resting state is illustrated in FIG. 8. In a first time period T1C, the battery pack 2A is in the discharging state. At this moment, a load source is discharging the first battery cell 21 and the second battery cell 22. In a second time period T2C, the battery pack 2A is in the resting state. At this moment, there is a circulating current in the battery pack 2A, and the branch currents of the first battery cell 21 and the second battery cell 22 are not equal to zero. In a third time period T3C, the battery pack 2A is in the balancing state. At this moment, there is no circulating current in the battery pack 2A, and the branch currents of the first battery cell 21 and the second battery cell 22 are equal to zero. The internal resistance calculating device 12 is configured to obtain the internal resistance of each of the first battery cell 21 and the second battery cell 22 according to the variation of the terminal voltage of each of the first battery cell 21 and the second battery cell 22 and the variation of the branch circuit of each of the first battery cell 21 and the second battery cell 22 between the two adjacent time points before and after the battery pack 2A is switched from the discharging state to the resting state. The first open-circuit voltage calculating device 13 is configured to obtain the balancing open-circuit voltage of the battery pack 2A according to the terminal voltage of each of the first battery cell 21 and the second battery cell 22 when the battery pack 2A is in the balancing state. The first state of charge calculating device 14 is configured to obtain the balancing state of charge of the battery pack 2A according to the balancing open-circuit voltage. The second open-circuit voltage calculating device 15 is configured to obtain the relation of the open-circuit voltages of the first battery cell 21 and the second battery cell 22 at the time point before the battery pack 2A is switched from the discharging state to the resting state according to the internal resistance of each of the first battery cell 21 and the second battery cell 22 and the branch circuit of each of the first battery cell 21 and the second battery cell 22 at the time point before the battery pack 2A is switched from the discharging state to the resting state. The second state of charge calculating device 16 is configured to obtain the state of charge of each of the first battery cell 21 and the second battery cell 22 at the time point before the battery pack 2A is switched from the discharging state to the resting state according to the open-circuit voltages of the first battery cell 21 and the second battery cell 22 and the balancing state of charge. The aging difference calculating device 17 is configured to obtain the aging differential index of the first battery cell 21 and the second battery cell 22 according to the state of charge of each of the first battery cell 21 and the second battery cell 22 at the time point before the battery pack 2A is from the discharging state to the resting state and the branch current of each of the first battery cell 21 and the second battery cell 22 at the time point after the battery pack 2A is switched from the discharging state to the resting state. The aging level determining device 18 is configured to determine the relative aging level of the first battery cell 21 and the second battery cell 22 according to the aging differential index. In other words, the battery diagnosing system 1A of the first embodiment determines the relation of the first aging level of the first battery cell 21 and the second aging level of the second battery cell 22 according to the parameters obtained when the battery pack 2A is switched from the charging state to the resting state. On the other hand, the battery diagnosing system 1C of this embodiment determines the relation of the first aging level of the first battery cell 21 and the second aging level of the second battery cell 22 according to the parameters, as shown in following Table 2, obtained when the battery pack 2A is switched from the discharging state to the resting state. Furthermore, in this embodiment, a value of μ can be 1. Other steps and equations of this embodiment are similar to the ones of the first embodiment. Detailed description is omitted herein for simplicity.

TABLE 2

| Time point sequence | State | Branch current of first battery cell | Branch current of second battery cell | Terminal voltage of first battery cell | Terminal voltage of second battery cell |
|---|---|---|---|---|---|
| 1 | Discharging | −1.507 | −1.493 | 3.579 | 3.593 |
| 2 | Discharging | −1.507 | −1.493 | 3.579 | 3.593 |
| 3 | Resting | 0.173 | −0.173 | 3.673 | 3.672 |
| 4 | Resting | 0.121 | −0.121 | 3.674 | 3.673 |
| ... | ... | ... | ... | ... | ... |
| 3600 | Balancing | 0 | 0 | 3.872 | 3.872 |

Figure 9:
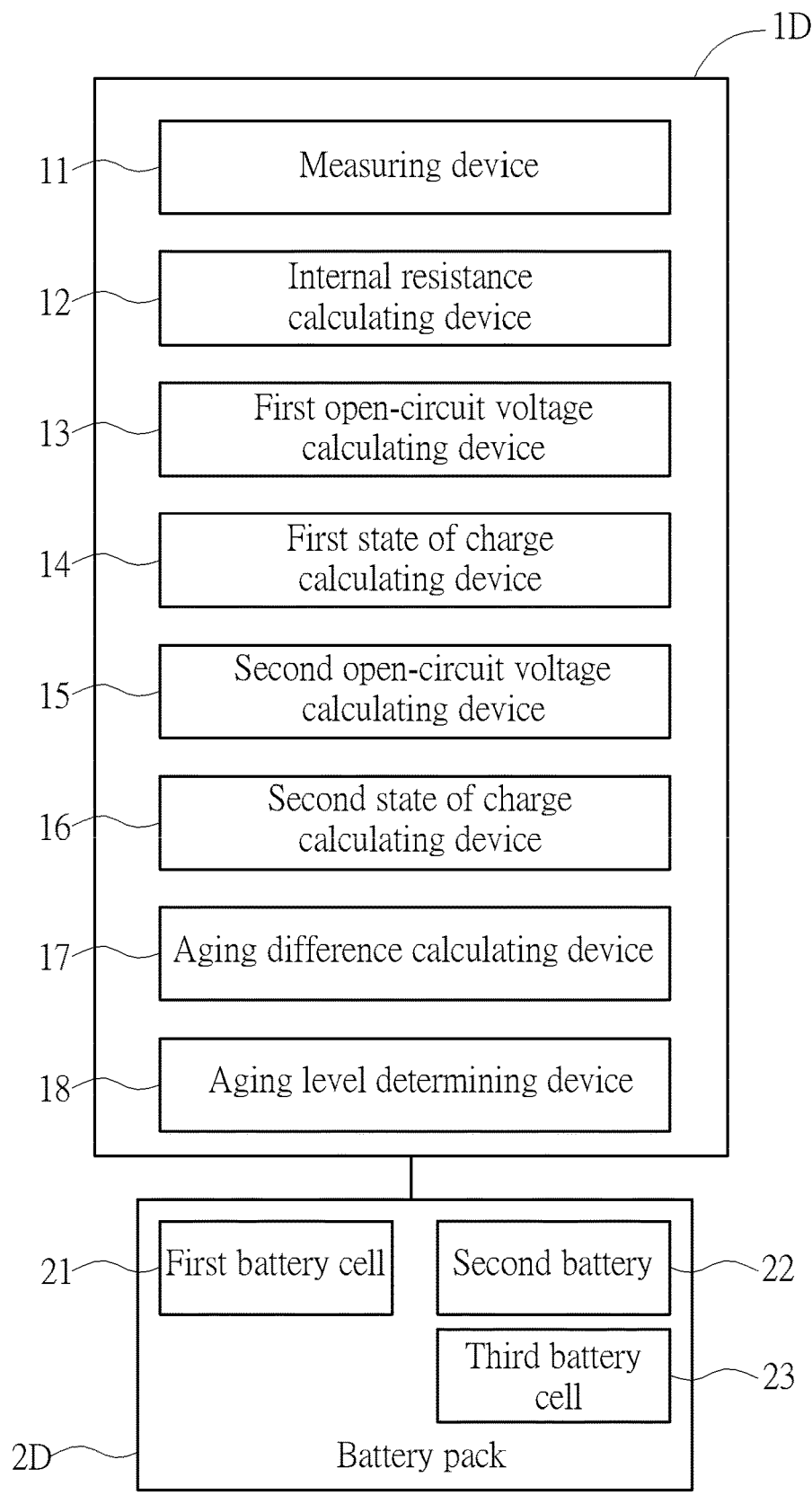
FIG. 9 is a functional block diagram of a battery diagnosing system according to a fourth embodiment of the present invention.
Figure 10A:
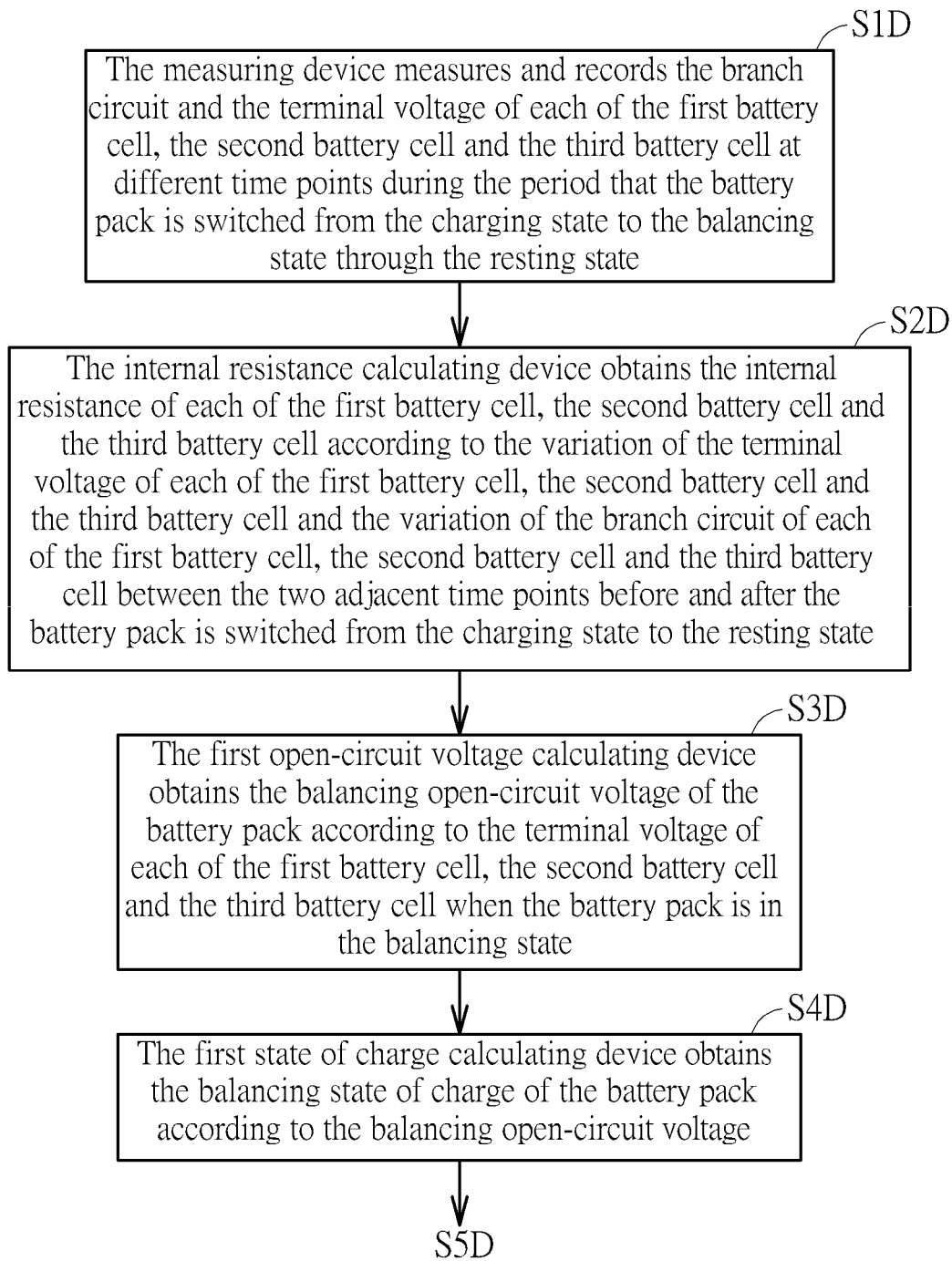
FIG. 10A and FIG. 10B are flow chart diagrams of a method of determining an aging difference of a first battery cell, a second battery cell and a third battery cell connected in parallel of a battery pack executed by the battery diagnosing system according to the fourth embodiment of the present invention.
Figure 10B:
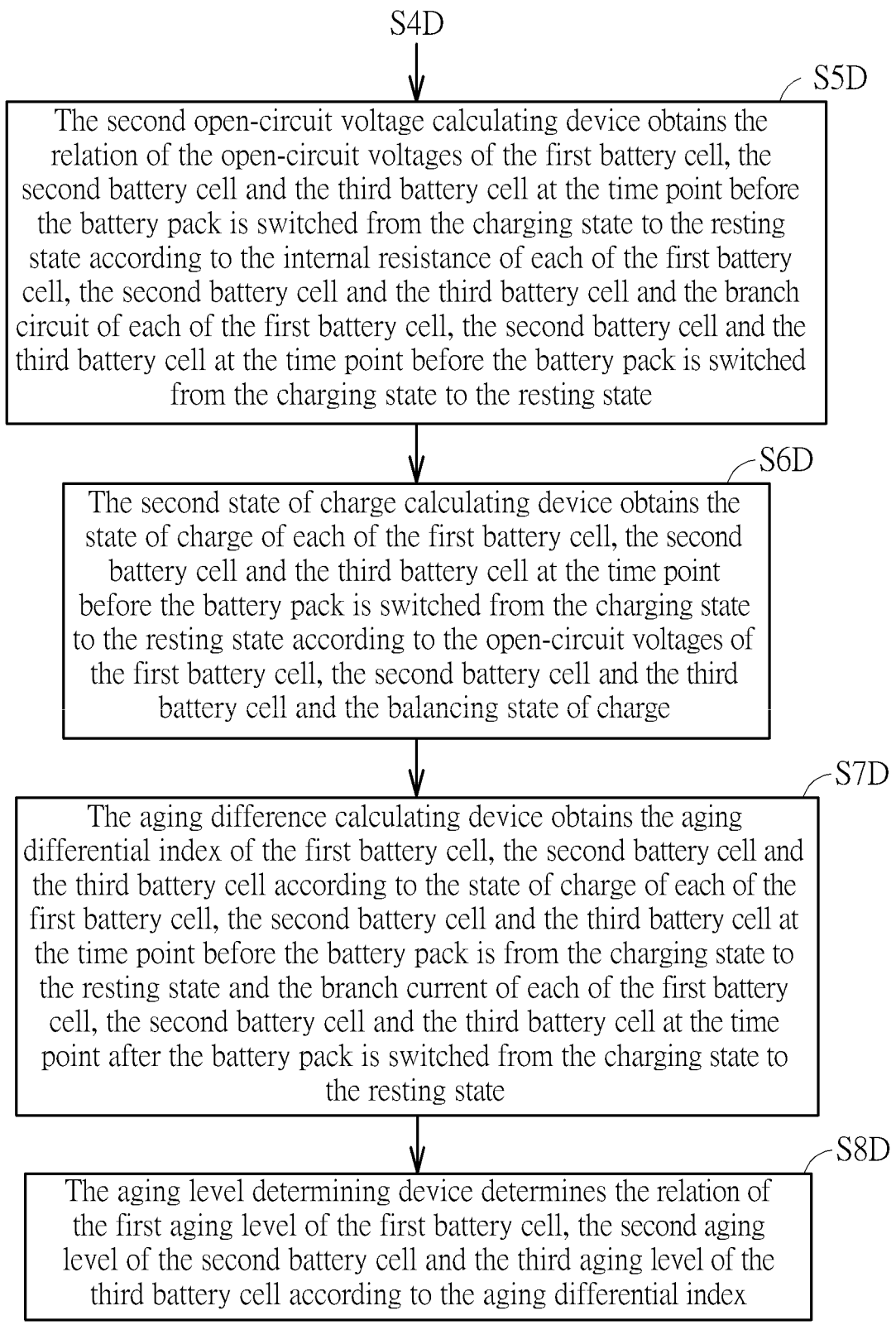

Please refer to FIG. 9, FIG. 10A and FIG. 10B. FIG. 9 is a functional block diagram of a battery diagnosing system 1D according to a fourth embodiment of the present invention. FIG. 10A and FIG. 10B are flow chart diagrams of a method of determining the aging difference of the first battery cell 21, the second battery cell 22 and a third battery cell 23 connected in parallel of a battery pack 2D executed by the battery diagnosing system 1D according to the fourth embodiment of the present invention. As shown in FIG. 9, FIG. 10A and FIG. 10B, the battery diagnosing system 1D of this embodiment includes components/devices similar to the ones of the battery diagnosing system 1A of the first embodiment. The battery diagnosing system 1D of this embodiment determines the relation of the first aging level of the first battery cell 21, the second aging level of the second battery cell 22 and a third aging level of the third battery cell 23 according to the parameters, as shown in following Table 3, obtained when the battery pack 2D is switched from the charging state to the resting state.

TABLE 3

| Time point sequence | State | Branch current of first battery cell | Branch current of second battery cell | Branch current of third battery cell | Terminal voltage of first battery cell | Terminal voltage of second battery cell | Terminal voltage of third battery cell |
|---|---|---|---|---|---|---|---|
| 1 | Charging | 1.507 | 1.493 | 1.495 | 3.980 | 3.979 | 3.980 |
| 2 | Charging | 1.507 | 1.493 | 1.495 | 3.980 | 3.979 | 3.980 |
| 3 | Resting | −0.043 | 0.015 | 0.028 | 3.893 | 3.890 | 3.889 |
| 4 | Resting | −0.032 | 0.012 | 0.020 | 3.892 | 3.889 | 3.888 |
| ... | ... | ... | ... | ... | ... | ... | ... |
| 3600 | Balancing | 0 | 0 | 0 | 3.872 | 3.872 | 3.872 |

Furthermore, the battery pack 2D of this embodiment includes the first battery cell 21, the second battery cell 22 and the third battery cell 23, but the battery pack 2A of the first embodiment includes the first battery cell 21 and the second battery cell 22. Therefore, Equation 1 can be respectively revised to be Equations 5-6, Equation 2 can be revised to be Equation 7, and Equation 3 can be revised to be Equations 8-10.

$$U_1 + I_1 R_1 = U_2 + I_2 R_2 \qquad \text{Equation 5}$$

$$U_2 + I_2 R_2 = U_3 + I_3 R_3 \qquad \text{Equation 6}$$

$$\frac{SoC_1 + SoC_2 + SoC_3}{3} = SoC_b \qquad \text{Equation 7}$$

$$\alpha_{12} = \frac{SoC_1 - SoC_2}{\mu \cdot \sum |I_n|} \qquad \text{Equation 8}$$

$$\alpha_{13} = \frac{SoC_1 - SoC_3}{\mu \cdot \sum |I_n|} \qquad \text{Equation 9}$$

$$\alpha_{23} = \frac{SoC_2 - SoC_3}{\mu \cdot \sum |I_n|} \qquad \text{Equation 10}$$

In aforementioned Equations 5-10, $U_1$, $U_2$ and $U_3$ are values of the open-circuit voltages of the first battery cell 21, the second battery cell 22 and the third battery cell 23 at the time point before the battery pack 2D is switched from the charging state to the resting state. $I_1$, $I_2$ and $I_3$ are values of the branch currents of the first battery cell 21, the second battery cell 22 and the third battery cell 23 at the time point before the battery pack 2D is switched from the charging state. $R_1$, $R_2$ and $R_3$ are values of the internal resistances the first battery cell 21, the second battery cell 22 and the third battery cell 23. $SoC_b$ is a value of the balancing state of charge of the battery pack 2D. $SoC_1$, $SoC_2$ $SoC_3$ are values of the states of charge of the first battery cell 21, the second battery cell 22 and the third battery cell 23 at the time point before the battery pack 2D is switched from the charging state. $\alpha_{12}$, $\alpha_{13}$ and $\alpha_{23}$ respectively are values of the aging differential index of the first battery cell 21 and the second battery cell 22, the aging differential index of the first battery cell 21 and the third battery cell 23 and the aging differential index of the second battery cell 22 and the third battery cell 23. A value of $\mu$ is a constant. $I_n$ is a value of the branch current of each of the first battery cell 21, the second battery cell 22 and the third battery cell 23 at the time point after the battery pack 2D is switched from the charging state to the resting state, and a unit thereof is amp.

Similar to the first embodiment, the second state of charge calculating device 16 of this embodiment also utilizes recursion to determine that the open-circuit voltages of the first battery cell 21 and the second battery cell 22 at the time point before the battery pack 2D is switched from the charging state to the resting state are 3.8756 volts, 3.8704 volts and 3.8673 volts, and further determine the states of charge of the first battery cell 21, the second battery cell 22 and the third battery cell 23 at the time point before the battery pack 2D is switched from the charging state to the resting state are 50.5%, 49.7% and 49.1%, respectively. In this embodiment, $\mu$ can be $-1$. The aging difference calculating device 17 can determine that the aging differential index of the first battery cell 21 and the second battery cell 22 is $-9.302\%$ by introducing the states of charge of the first battery cell 21 and the second battery cell 22 at the time point before the battery pack 2D is switched from the charging state to the resting state and the branch currents of the first battery cell 21 and the second battery cell 22 at the time point after the battery pack 2D is switched from the charging state to the resting state into Equation 8. The aging difference calculating device 17 can determine that the aging differential index of the first battery cell 21 and the third battery cell 23 is $-16.279\%$ by introducing the states of charge of the first battery cell 21 and the third battery cell 23 at the time point before the battery pack 2D is switched from the charging state to the resting state and the branch currents of the first battery cell 21 and the third battery cell 23 at the time point after the battery pack 2D is switched from the charging state to the resting state into Equation 9. The aging difference calculating device 17 can determine that the aging differential index of the second battery cell 22 and the third battery cell 23 is $-6.977\%$ by introducing the states of charge of the second battery cell 22 and the third battery cell 23 at the time point before the battery pack 2D is switched from the charging state to the resting state and the branch currents of the second battery cell 22 and the third battery cell 23 at the time point after the battery pack 2D is switched from the charging state to the resting state into Equation 10. Accordingly, the aging level determining device 18 can determine the first aging level of the first battery cell 21 is less than the second aging level of the second battery cell 22 and a third aging level of the third battery cell 23, the second aging level of the second battery cell 22 is less than the third aging level of the third battery cell 23, and the second aging level of the second battery cell 22 is closer to the third aging level of the third battery cell 23 than the first aging level of the first battery cell 21 is. Furthermore, when any one of the first battery cell 21, the second battery cell 22 and the third battery cell 23 are known, the other two of the first battery cell 21, the second battery cell 22 and the third battery cell 23 can be obtained by Equation 4 of the second embodiment.

It should be noticed that, the present invention is not limited to the aforementioned embodiments. For example, with popularization of electric vehicles, the number of obsolete batteries is growing rapidly. Although the obsolete batteries which have been used for years, cannot meet requirements of driving vehicles, they still have other application values. The present invention can help the user to know the aging level of the obsolete batteries relative to each other, so as to select the matching batteries, i.e., the batteries having the similar aging levels, for reuse or conversion, for example, in energy storage systems, for reducing pollution and cost of waste disposal.

The measuring device, the internal resistance calculating device, the first open-circuit voltage calculating device, the first state of charge calculating device, the second open-circuit voltage calculating device, the second state of charge calculating device, the aging difference calculating device and the aging level determining device can be implemented in software, firmware, hardware configuration, or a combination thereof. For example, any aforementioned device can be a computer including a processor and a computer readable recording medium storing a program code. The processor can execute the program code to achieve the corresponding function. The processor can be a central processing unit, an application processor, a microprocessor, etc., or can be realized by application specific integrated circuits (ASIC). However, the present disclosure is not limited thereto. The computer readable recording medium can be a read-only memory (ROM), a random-access memory (RAM), a CDROM, a magnetic tape, a floppy disk, a hard disk or an optical storage device. However, the present invention is not limited to this embodiment.

In summary, the present invention can determine the aging difference of the two battery cells connected in parallel of the battery pack, which allows a user to recognize and replace the battery cell which has the greater aging level without replacing the entire battery pack. Therefore, the present invention can not only reduce a negative impact caused by the excessive aging difference but also prevent waste of resource.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of determining an aging difference of a plurality of battery cells connected in parallel of a battery pack, the method comprising:
   measuring and recording a branch circuit and a terminal voltage of each of the plurality of battery cells at different time points during a period that the battery pack is switched from a charging state or a discharging state to a balancing state through a resting state;
   obtaining an internal resistance of each of the plurality of battery cells according to a variation of the terminal voltage of each of the plurality of battery cells and a variation of the branch circuit of each of the plurality of battery cells between two adjacent time points before and after the battery pack is switched from the charging state or the discharging state to the resting state;
   obtaining a balancing open-circuit voltage of the battery pack according to the terminal voltage of each of the plurality of battery cells when the battery pack is in the balancing state;
   obtaining a balancing state of charge of the battery pack according to the balancing open-circuit voltage;
   obtaining at least one relation of a plurality of open-circuit voltages of the plurality of battery cells at the time point before the battery pack is switched from the charging state or the discharging state to the resting state according to the internal resistance of each of the plurality of battery cells and the branch circuit of each of the plurality of battery cells at the time point before the battery pack is switched from the charging state or the discharging state to the resting state;

obtaining a state of charge of each of the plurality of battery cells at the time point before the battery pack is switched from the charging state or the discharging state to the resting state according to the plurality of open-circuit voltages of the plurality of battery cells and the balancing state of charge;

obtaining an aging differential index of two battery cells of the plurality of battery cells according to the state of charge of each of the plurality of battery cells at the time point before the battery pack is from the charging state or the discharging state to the resting state and the branch current of each of the plurality of battery cells at the time point after the battery pack is switched from the charging state or the discharging state to the resting state; and determining a relative aging level of the two battery cells of the plurality of battery cells according to the aging differential index.

2. The method of claim 1, wherein measuring and recording the branch circuit and the terminal voltage of each of the plurality of battery cells at the different time points during the period that the battery pack is switched from the charging state or the discharging state to the balancing state through the resting state comprising:

measuring and recording the branch circuit and the terminal voltage of each of the plurality of battery cells at the different time points and at a predetermined sampling frequency during the period that the battery pack is switched from the charging state or the discharging state to the balancing state through the resting state.

3. The method of claim 2, wherein the predetermined sampling frequency is equal to or greater than 1 Hertz.

4. The method of claim 1, further comprising:

obtaining a second aging level index of a second battery cell of the two battery cells of the plurality of battery cells according to the aging differential index and a first aging level index of a first battery cell of the two battery cells of the plurality of battery cells.

5. The method of claim 1, wherein a first aging level of a first battery cell of the two battery cells of the plurality of battery cells is equal to a second aging level of a second battery cell of the two battery cells of the plurality of battery cells when the aging differential index is equal to zero, the first aging level of the first battery cell of the two battery cells of the plurality of battery cells is less than the second aging level of the second battery cell of the two battery cells of the plurality of battery cells when the aging differential index is less than zero, and the first aging level of the first battery cell of the two battery cells of the plurality of battery cells is greater than the second aging level of the second battery cell of the two battery cells of the plurality of battery cells when the aging differential index is greater than zero.

6. A battery diagnosing system capable of determining an aging difference of a plurality of battery cells connected in parallel of a battery pack, the battery diagnosing system comprising:

a measuring device configured to measure and record a branch circuit and a terminal voltage of each of the plurality of battery cells at different time points during a period that the battery pack is switched from a charging state or a discharging state to a balancing state through a resting state;

an internal resistance calculating device configured to obtain an internal resistance of each of the plurality of battery cells according to a variation of the terminal voltage of each of the plurality of battery cells and a variation of the branch circuit of each of the plurality of battery cells between two adjacent time points before and after the battery pack is switched from the charging state or the discharging state to the resting state;

a first open-circuit voltage calculating device configured to obtain a balancing open-circuit voltage of the battery pack according to the terminal voltage of each of the plurality of battery cells when the battery pack is in the balancing state;

a first state of charge calculating device configured to obtain a balancing state of charge of the battery pack according to the balancing open-circuit voltage;

a second open-circuit voltage calculating device configured to obtain at least one relation of a plurality of open-circuit voltages of the plurality of battery cells at the time point before the battery pack is switched from the charging state or the discharging state to the resting state according to the internal resistance of each of the plurality of battery cells and the branch circuit of each of the plurality of battery cells at the time point before the battery pack is switched from the charging state or the discharging state to the resting state;

a second state of charge calculating device configured to obtain a state of charge of each of the plurality of battery cells at the time point before the battery pack is switched from the charging state or the discharging state to the resting state according to the plurality of open-circuit voltages of the plurality of battery cells and the balancing state of charge;

an aging difference calculating device configured to obtain an aging differential index of two battery cells of the plurality of battery cells according to the state of charge of each of the plurality of battery cells at the time point before the battery pack is from the charging state or the discharging state to the resting state and the branch current of each of the plurality of battery cells at the time point after the battery pack is switched from the charging state or the discharging state to the resting state; and an aging level determining device configured to determine a relative aging level of the two battery cells of the plurality of battery cells according to the aging differential index.

7. The battery diagnosing system of claim 6, wherein the measuring device is configured to measure and record the branch circuit and the terminal voltage of each of the plurality of battery cells at the different time points and at a predetermined sampling frequency during the period that the battery pack is switched from the charging state or the discharging state to the balancing state through the resting state.

8. The battery diagnosing system of claim 7, wherein the predetermined sampling frequency is equal to or greater than 1 Hertz.

9. The battery diagnosing system of claim 6, further comprising:

an aging index calculating device configured to obtain a second aging level index of a second battery cell of the two battery cells of the plurality of battery cells according to the aging differential index and a first aging level index of a first battery cell of the two battery cells of the plurality of battery cells.

10. The battery diagnosing system of claim 6, wherein a first aging level of a first battery cell of the two battery cells of the plurality of battery cells is equal to a second aging level of a second battery cell of the two battery cells of the plurality of battery cells when the aging differential index is equal to zero, the first aging level of the first battery cell of the two battery cells of the plurality of battery cells is less than the second aging level of the second battery cell of the two battery cells of the plurality of battery cells when the aging differential index is less than zero, and the first aging level of the first battery cell of the two battery cells of the plurality of battery cells is greater than the second aging level of the second battery cell of the two battery cells of the plurality of battery cells when the aging differential index is greater than zero.

* * * * *